United States Patent
Rostalski et al.

(10) Patent No.: US 7,834,981 B2
(45) Date of Patent: Nov. 16, 2010

(54) PROJECTION EXPOSURE APPARATUS, PROJECTION EXPOSURE METHOD AND PROJECTION OBJECTIVE

(75) Inventors: Hans-Juergen Rostalski, Oberkochen (DE); Heiko Feldmann, Aalen (DE); Wilhelm Ulrich, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 665 days.

(21) Appl. No.: 11/747,630

(22) Filed: May 11, 2007

(65) Prior Publication Data

US 2008/0117400 A1 May 22, 2008

(30) Foreign Application Priority Data

May 11, 2006 (DE) ............... 10 2006 022 958

(51) Int. Cl.
*G03B 27/54* (2006.01)
*G03B 27/42* (2006.01)

(52) U.S. Cl. ............................... 355/67; 355/53

(58) Field of Classification Search .......... 355/53, 355/67–71; 359/359
See application file for complete search history.

(56) References Cited

U.S. PATENT DOCUMENTS

| 620,978 | A | 3/1899 | Schupmann |
|---|---|---|---|
| 5,212,593 | A | 5/1993 | Williamson et al. |
| 5,402,267 | A | 3/1995 | Furter et al. |
| 6,424,471 | B1 | 7/2002 | Ulrich et al. |
| 6,451,507 | B1 * | 9/2002 | Suenaga et al. ............. 430/311 |
| 6,600,608 | B1 | 7/2003 | Shafer et al. |
| 6,636,350 | B2 | 10/2003 | Shafer et al. |
| 6,665,126 | B2 | 12/2003 | Shafer et al. |
| 6,707,616 | B1 * | 3/2004 | Takahashi et al. ........... 359/649 |
| 6,806,942 | B2 | 10/2004 | Schuster et al. |
| 6,831,731 | B2 * | 12/2004 | Omura et al. ................ 355/67 |
| 6,909,492 | B2 * | 6/2005 | Omura ........................ 355/67 |
| 6,995,918 | B2 | 2/2006 | Terasawa et al. |
| 7,362,508 | B2 * | 4/2008 | Omura et al. ............... 359/649 |
| 2003/0011755 | A1 | 1/2003 | Omura et al. |
| 2004/0160677 | A1 | 8/2004 | Epple et al. |
| 2005/0094289 | A1 | 5/2005 | Kreuzer |
| 2006/0082904 | A1 | 4/2006 | Kato et al. |
| 2006/0132931 | A1 | 6/2006 | Epple et al. |
| 2006/0268253 | A1 | 11/2006 | Dodoc |

FOREIGN PATENT DOCUMENTS

| DE | 102 21 386 A1 | 11/2003 |
|---|---|---|
| DE | 103 16 428 A1 | 10/2004 |
| EP | 1 069 448 A1 | 1/2001 |
| EP | 1 102 100 A2 | 5/2001 |
| WO | WO 2004/090600 A2 | 10/2004 |
| WO | WO 2006/125790 A | 11/2006 |

* cited by examiner

*Primary Examiner*—Hung Henry Nguyen
(74) *Attorney, Agent, or Firm*—Sughrue Mion, PLLC

(57) ABSTRACT

A projection exposure apparatus for the exposure of a radiation-sensitive substrate arranged in the region of an image surface of a projection objective with at least one image of a pattern of a mask that is arranged in the region of an object surface of the projection objective has a light source for emitting ultraviolet light from a wavelength band having a bandwidth $\Delta\lambda>10$ pm around a central operating wavelength $\lambda>200$ nm; an illumination system for receiving the light from the light source and for directing illumination radiation onto the pattern of the mask; and a projection objective for the imaging of the structure of the mask onto a light-sensitive substrate. The projection objective is a catadioptric projection objective having at least one concave mirror arranged in a region of a pupil surface of the projection objective, and a negative group having at least one negative lens arranged in direct proximity to the concave mirror in a region near the pupil surface, where a marginal ray height (MRH) of the imaging is greater than a chief ray height (CRH).

52 Claims, 5 Drawing Sheets

PROJECTION EXPOSURE APPARATUS, PROJECTION EXPOSURE METHOD AND PROJECTION OBJECTIVE

BACKGROUND OF THE INVENTION

This application claims the benefit of German Patent Application No. DE 10 2006 022 958.4 filed on May 11, 2006. The disclosure of this patent application is incorporated herein in its entirety by reference.

FIELD OF THE INVENTION

The invention relates to a projection exposure apparatus for the exposure of a radiation-sensitive substrate arranged in the region of an image surface of a projection objective with at least one image of a pattern of a mask that is arranged in the region of an object surface of the projection objective and to a projection exposure method that can be carried out with the aid of the projection exposure apparatus and to a projection objective capable of being used in that apparatus and method.

DESCRIPTION OF THE RELATED PRIOR ART

Nowadays, predominantly microlithographic projection exposure methods are used for the fabrication of semiconductor components and other finely patterned components. This involves using masks (reticle), that carry or form the pattern of a structure to be imaged, for example a line pattern of a layer of a semiconductor component. A mask is positioned into a projection exposure apparatus between illumination system and projection objective in the region of the object surface of the projection objective and illuminated with an illumination light provided by the illumination system. The light altered by the mask and the pattern passes as projection light through the projection objective, which is designed as a reducing objective and images the pattern of the mask on a demagnifying scale onto the substrate to be exposed, which normally carries a radiation-sensitive layer (photoresist).

In the selection of suitable projection exposure apparatuses and methods for a lithography process, it is necessary to take account of various technical and economic criteria that are oriented, inter alia, to the typical structure size of the structures to be produced within the exposed substrate. The structures of the semiconductor components that are to be produced may contain tiny metallic tracks and/or silicon tracks and other structure elements, the critical dimensions (CD) of which may be significantly smaller than the operating wavelength of the ultraviolet light used for imaging.

The fabrication of large-scale integrated semiconductor components often necessitates producing at least some layers of a three-dimensional patterned component under conditions for which the image-side numerical aperture NA of the projection objective and the operating wavelength λ of the ultraviolet light used suffice to obtain a resolution R in accordance with the equation $R=k_1(\lambda/NA)$ with the process-dependent constant $k_1<1$, which resolution may be e.g. less than 100 nm for critical layers. The projection exposure apparatuses optimized for such high resolutions typically use operating wavelengths λ<200 nm, in particular λ=193 nm or λ=157 nm.

At wavelengths λ≦200 nm, however, there are only a few sufficiently transparent materials available for producing the transparent optical elements. They include primarily synthetic fused silica, which is sufficiently transparent down to 193 nm, and also some fluoride crystal materials, which still exhibit sufficiently low absorption even at wavelengths of 157 nm or less. In this case primarily calcium fluoride and barium fluoride are of practical importance for the production of lenses and other optical elements. However, since the Abbe numbers of said materials are relatively close together, it is difficult to correct chromatic aberrations using purely refractive means in this wavelength range. Therefore, catadioptric projection objectives, which in addition to a multiplicity of lenses also contain at least one concave mirror, are used for λ=193 nm and in particular for λ=157 nm.

Many known catadioptric projection objectives having one or two intermediate images have at least one concave mirror which is arranged in the region of a pupil surface of the optical system and in direct proximity to which at least one negative lens is situated. The negative lens near the pupil can provide a chromatic overcorrection that can at least partly compensate for the chromatic undercorrection of other objective parts. Examples of such projection objectives having a single intermediate image and also geometrical or physical beam splitting and at least one plane folding mirror are shown in WO 2004/090600 A2 or the patents U.S. Pat. No. 6,424,471 B1 or U.S. Pat. No. 6,665,126 B2 by the applicant.

Projection objectives are also known which comprise three cascaded imaging objective parts, that is to say have two intermediate images. A first, refractive subsystem (abbreviation "R") generates a first real intermediate image of an object. A second, catadioptric subsystem (abbreviation "C") having a concave mirror generates a real second intermediate image from the first intermediate image. A third, refractive subsystem images the second intermediate image into the image plane. In the examples for an operating wavelength of 157 nm that are shown in US 2003/0011755 A1 the deflection of the beam path between these three objective parts is achieved by two plane mirrors oriented at right angles to one another, whereby object plane and image plane of the projection objective are oriented parallel to one another.

There are also unfolded catadioptric projection objectives having a rectilinearly continuous optical axis (in line systems), which have a concave mirror arranged near the pupil with an assigned negative lens and also at least one further concave mirror. Embodiments for an operating wave-length of 193 nm having a first catadioptric objective part having two concave mirrors for generating an intermediate image and a second, refractive objective part for imaging the intermediate image onto the image surface are shown in EP 1 069 448 A1. U.S. Pat. No. 6,600,608 discloses in line systems with pupil obscuration which have two concave mirrors that are near the pupil and pierced in the utilized region.

For the production of medium-critical or non-critical layers having typical structure sizes of significantly more than 150 nm, by contrast, projection exposure apparatuses designed for operating wavelengths of more than 200 nm are conventionally employed. In this wavelength range, use is made of purely refractive (dioptric) reducing objectives, the production of which is readily controllable owing to their rotational symmetry about the optical axis. In this case, primarily projection exposure apparatuses for an operating wavelength of 365.5 nm±2 nm (so-called i-line systems) have been in use for a long time. They utilize the i-line of mercury vapor lamps, the natural bandwidth thereof being limited to a narrower utilized bandwidth Δλ, e.g. of approximately 2 nm, with the aid of a filter or in some other way. In the case of light sources of this type, ultraviolet light of a relatively wide wavelength band is utilized during projection, with the result that the projection objective has to effect a relatively great correction of chromatic aberrations in order to ensure low-aberration imaging even with such broadband projection light at the resolution sought.

In the case of refractive projection objectives operated in broadband fashion, for chromatic correction use is made of various lens materials having sufficiently different Abbe numbers which are distributed suitably within the projection objective in regions of different ray height ratios in order to obtain the chromatic correction. The transparent materials used in typical i-line projection objectives include, in particular, synthetic fused silica and the special glasses from the company SCHOTT, Mainz, Germany sold under the designations FK5, LF5 and LLF1. In the case of these optical glasses, the synthetic fused silica and the FK5 glass are typical representatives of glasses having relatively low dispersion (crown glasses) while the LF5 and LLF1 glasses are typical representatives of glasses having relatively high dispersion (flint glasses). The known forms of refractive reducing objectives having a plurality of waists and bulges are employed. Examples of three-bulge systems having a demagnifying action with NA>0.6 which have three bulges having overall a positive refractive power and two waists having overall a negative refractive power and in which defined distributions of high-dispersion glasses and low-dispersion glasses are used for chromatic correction are shown in the German patent application DE 102 21 386 A1 (corresponding to U.S. Pat. No. 6,806,942 B2).

SUMMARY OF THE INVENTION

It is an object of the invention to provide a projection exposure apparatus which is able to ensure, with relatively broadband projection radiation at operating wavelengths of λ>200 nm, a demagnifying imaging of mask structures that is largely free of chromatic aberrations, and which at the same time can be produced economically with narrow quality tolerances.

To address this and other objects, the invention, according to one formulation, provides a projection exposure apparatus for the exposure of a radiation-sensitive substrate arranged in the region of an image surface of a projection objective with at least one image of a pattern of a mask that is arranged in the region of an object surface of the projection objective comprising:

a light source emitting ultraviolet light from a wavelength band having a bandwidth Δλ>10 pm around a central operating wavelength λ>200 nm;

an illumination system receiving the light from the light source and directing illumination radiation onto the pattern of the mask; and a projection objective projecting a demagnified image of the pattern of the mask onto a light-sensitive substrate with projection light from a wavelength band having a bandwidth Δλ>10 pm around a central operating wavelength λ>200 nm with an image-side numerical aperture NA>0.6;

wherein the projection objective is a catadioptric projection objective and has at least one concave mirror, arranged in a region of a pupil surface of the projection objective, and a negative group having at least one negative lens arranged in direct proximity to the concave mirror in a region near the pupil surface, where a marginal ray height (MRH) of the imaging is greater than a chief ray height (CRH).

Experts previously assumed that in projection exposure apparatuses with light sources radiating in relatively broadband fashion from the wavelength range λ>200 nm, refractive projection objectives are preferable since numerous lens materials that are sufficiently different with regard to dispersion and refractive index are available for the chromatic correction and it is therefore possible to work with purely refractive projection objectives that are readily controllable in terms of production engineering, in order to construct for example a chromatically corrected i-line objective (that is to say an objective for an operating wavelength of approximately 365 nm). Nowadays, however, this assumption is no longer correct or is only partly correct. Since projection objectives for wavelengths from the deep ultraviolet range (DUV), for example for 193 nm or 157 nm, have been constructed on a relatively large scale for several years now, the market for the glasses that are suitable for achromatization (chromatic correction) at higher wavelengths no longer exists on a scale such that these types of glasses are available in sufficient quantity and quality. The inventors have recognized that problems resulting from this can be avoided if a chromatically corrected catadioptric projection objective having at least one concave mirror is used instead of a chromatically corrected refractive projection objective.

This catadioptric design approach makes it possible, inter alia, to provide projection objectives exhibiting a sufficiently high degree of correction of chromatic aberrations which do not require different lens materials for the chromatic correction. As is known, it is possible to achieve an achromatization by combining a converging lens made of a material having relatively low dispersion and an assigned diverging lens made of a second material having relatively high dispersion. In this case, the achromatization becomes simpler, the greater the difference in dispersion. The resultant restrictions in the choice of material can be avoided by means of the invention. By way of example, it is possible for at least 90% of all the lenses or else all the lenses of the projection objective to be produced from one or a plurality of materials having essentially the same dispersion. A difference in dispersion that possibly exists may be less than 10%, in particular less than 5%. By way of example, in a fused silica system, instead of a lens made of synthetic fused silica, it is also possible to provide a lens made of FK5, which at 193 nm only has a dispersion that is approximately 3% higher.

In some embodiments, it is provided that at least 90% of all the lenses of the projection objective are produced from the same material. Preferably, all the transparent optical components consist of the same material. Particularly the use of synthetic fused silica for the majority or all of the transparent optical components is regarded as advantageous since this material, which is sufficiently transparent down to 193 nm, is now available on a large scale with high quality.

If synthetic fused silica is used as lens material, it may be useful for the lenses that are exposed to particularly high radiation loadings and have small diameters, e.g. in the vicinity of the image surface to be produced not from synthetic fused silica but rather from a different lens material, such as calcium fluoride, in order for example to avoid problems due to a radiation-induced change in refractive index (e.g. compaction). In this case, the second material is not used for chromatic correction, but rather in order to improve the long-term stability of the entire projection objective.

In many embodiments, the concave mirror is arranged in the region of a pupil surface of the projection objective and a negative group having at least one negative lens is arranged in direct proximity to the concave mirror in a region near the pupil. A "region near the pupil" in this sense is distinguished, in particular, by the fact that the marginal ray height (MRH) of the imaging is greater than the chief ray height (CRH) in the region near the pupil. Preferably, the marginal ray height is at least twice as large, in particular at least 5 to 10 times as large, as the chief ray height in the region of the negative group. A negative group in the region of large marginal ray heights can contribute particularly effectively to the chromatic correction, in particular to the correction of the longitudinal chromatic aberration CHL, since the longitudinal chromatic aberration CHL of a thin lens is proportional to the square of the marginal ray height at the location of the lens (and proportional to the refractive power and inversely proportional to the dispersion of the lens). Added to this is the fact that the projection radiation passes twice, in opposite through radiating directions, through a negative group arranged in direct proximity to a concave mirror, with the result that the chromatically over-correcting effect of the negative group is utilized twice. The negative group may e.g. consist of a single negative lens or contain at least two negative lenses. It is also possible for the negative group to contain at least one diffractive optical element (DOE) (see e.g. U.S. application No. 60/699,843, not yet published).

It has been found that it is favourable if the diameters and refractive powers of the at least one optical element of the negative group are designed such that a sum of overcorrecting contributions of the negative group to the chromatic correction is at least 60% of the sum of the undercorrecting contributions of the remaining optical elements of the projection objective, preferably at least 65% or at least 70%.

A combination—acting in the manner of a "Schupmann achromat" (cf. U.S. Pat. No. 620,978)—of a concave mirror arranged near the pupil with a negative group arranged directly in front of the mirror surface can be utilized in catadioptric systems with a variety of constructions. Representative examples of folded catadioptric projection objectives having at least one intermediate image which have one or more planar folding mirrors in combination with a single catadioptric group that can be utilized for achromatization are shown for example in U.S. Pat. No. 6,909,492 B2 or US 2004/0160677 A1 or US 2003/0011755 A1. Unfolded projection objectives (in-line systems) having a concave mirror arranged near the pupil and having a further concave mirror are shown e.g. in EP 1 069 448 A1. Other in-line systems, in part having four or six concave mirrors, are shown in the patents U.S. Pat. No. 6,636,350 or U.S. Pat. No. 6,995,918. System types of this kind can be utilized in principle, with corresponding adaptation, in the context of the invention.

In the case of the embodiments referred to as "i-line systems" the light source comprises a mercury vapor lamp, in which the emitted ultraviolet light originates from a wavelength band having a central operating wavelength $\lambda=365.5$ nm. Typical bandwidths here are in the region of $\Delta\lambda=2$ nm. As an alternative, it is possible to use an XeF laser, for example, as the light source, the said laser having a typical bandwidth $\Delta\lambda=0.2$ nm at a central operating wavelength from the range around approximately 351 nm. Light-emitting diodes (LED) can also be utilized as the light source, the said diodes for example emitting light around a central operating wavelength $\lambda=248$ nm with a bandwidth of $\Delta\lambda=10$ nm. In the case of conventional KrF excimer lasers having a central operating wavelength $\lambda=248$ nm the bandwidth constriction that is conventionally utilized could be obviated, with the result that particularly cost-effective broadband variants of such light sources could be used.

In this case the term "light source" is intended to encompass not only the primary light source emitting a primary radiation, but also devices possibly present, such as filters, diaphragms, bandwidth constriction modules or the like, which serve to alter the spectrum of the primary radiation emitted by the primary light source prior to entering into the illumination system.

In order for the projection objective to function properly at a given wavelength or a given plurality of wavelengths within a desired wavelength band the projection objective must be configured to allow an exposure of substrates utilizing light from the wavelength band for which the projection objective is designed. This wavelength band may also be denoted as "design wavelength band" and denotes a range of wavelengths including those wavelengths for which the optical performance of the projection objective is sufficiently good to allow diffraction limited imaging with relatively low aberration level. For example, where the configuration of the projection objective is such that the design wavelength band includes mercury g-, h- and i-lines, the projection objective may be used in conjunction with a high power mercury-arc lamp as a light source of the projection exposure apparatus. Therefore, a projection objective configured for use with a mercury-arc lamp is corrected such that the wavelength band (design wavelength band) includes mercury g-, h- and i-lines. In such case, the optical performance is optimized for at least one of the mercury lines at about 365 nm (i-line), about 405 nm (h-line) and about 436 nm (g-line), whereas the optical performance may deteriorate significantly outside the design wavelength band. Typically, a projection objective exclusively optimized for a design wavelength band including mercury g-, h- and i-lines can not be operated for exposure at significantly smaller wavelength, such as in the deep ultraviolet (DUV) region with wavelengths smaller than about 260 nm and/or in the visible wavelength range, e.g. at wavelengths larger than about 500 nm.

The projection objective may be designed such that there is only one common focus at or close to one wavelength in the wavelength band. The wavelength may be that of one of the mercury lines, e.g. around the i-line at about 365 nm. A projection objective may also have two, three or more common foci at respective two or more wavelengths in a design wavelength band. Where the projection objective is corrected for two or more wavelengths, those wavelengths may be used for exposure, whereby a larger fraction of the output power of the light source can be utilized for the exposure, whereby a higher throughput of exposed substrates per time unit may be obtained.

In preferred embodiments the projection objective is configured such that there is at least one common focus at a wavelength $\lambda>320$ nm. In this case, a xenon fluoride laser (XeF laser) having a central operating wavelength in the range from approximately 351 nm to approximately 353 nm and typical band width of 0.2 nm may be used as a primary light source. Alternatively, the light source may comprise a mercury vapor lamp emitting mercury g-, h- and i-lines, where at least one of those lines, such as the mercury i-line at about 365 nm, may be used for exposure.

The invention also relates to the use of a catadioptric projection objective having at least one concave mirror for the demagnifying imaging of a pattern of a mask that is arranged in an object surface of the projection objective in an image surface of the projection objective, which image surface is optically conjugate with respect to the object surface, with the aid of projection light from a wavelength band having a bandwidth $\Delta\lambda>10$ pm around a central operating wavelength $\lambda>200$ nm with an image-side numerical aperture NA>0.6.

Although in the case of folded variants this possibility for utilizing catadioptric designs dispenses with the production-technological advantages of rotationally symmetrical, purely refractive projection objectives, new degrees of freedom are opened up as a result with regard to the materials that can be utilized for the transparent optical elements. With a catadioptric design approach it is possible, if appropriate, for all the lenses and other transparent optical elements to be produced from one and the same lens material, in particular synthetic fused silica. This eliminates the dependence on glass materials that are more and more difficult to find available in good quality, such as FK5, LF5 or LL1.

The invention also relates to a projection exposure method for the exposure of a radiation-sensitive substrate arranged in the region of an image surface of a projection objective with at least one image of a pattern of a mask that is arranged in the region of an object surface of the projection objective, including:

illuminating the mask with illumination light from a wavelength band having a bandwidth $\Delta\lambda > 10$ pm around a central operating wavelength $\lambda > 200$ nm;

projecting a demagnified image of the pattern of the mask using projection light from a wavelength band having a bandwidth $\Delta\lambda > 10$ pm around a central operating wavelength $\lambda > 200$ nm with an image-side numerical aperture NA>0.6 and a catadioptric projection objective containing at least one concave mirror arranged in a region of a pupil surface of the projection objective, and a negative group having at least one negative lens arranged in direct proximity to the concave mirror in a region near the pupil surface, where a marginal ray height (MRH) of the imaging is greater than a chief ray height (CRH).

These and further features emerge not only from the claims but also from the description and the drawings, in which case the individual features may be realized, and constitute advantageous and inherently protectable embodiments, in each case by themselves or as a plurality in the form of subcombinations in an embodiment of the invention and in other fields. Exemplary embodiments of the invention are illustrated in the drawings and are explained in more detail below.

DETAILED DESCRIPTION OF THE PREFERRED EMBODIMENTS

In the following description of preferred embodiments, the term "optical axis" denotes a straight line or a sequence of straight line segments through the centers of curvature of the optical components. The optical axis is folded at folding mirrors (deflection mirrors) or other reflective surfaces. In the examples, the object is a mask (reticle) having the pattern of an integrated circuit; a different pattern, for example of a grating, may also be involved. In the examples, the image is projected onto a wafer which is provided with a photoresist layer and which serves as a substrate. Other substrates, for example elements for liquid crystal displays or substrates for optical gratings, are also possible.

The specifications of the exemplary embodiments shown in the figures of the drawings are specified in tables, the numbering of which respectively corresponds to the numbering of the corresponding figure of the drawings.

Figure 1:
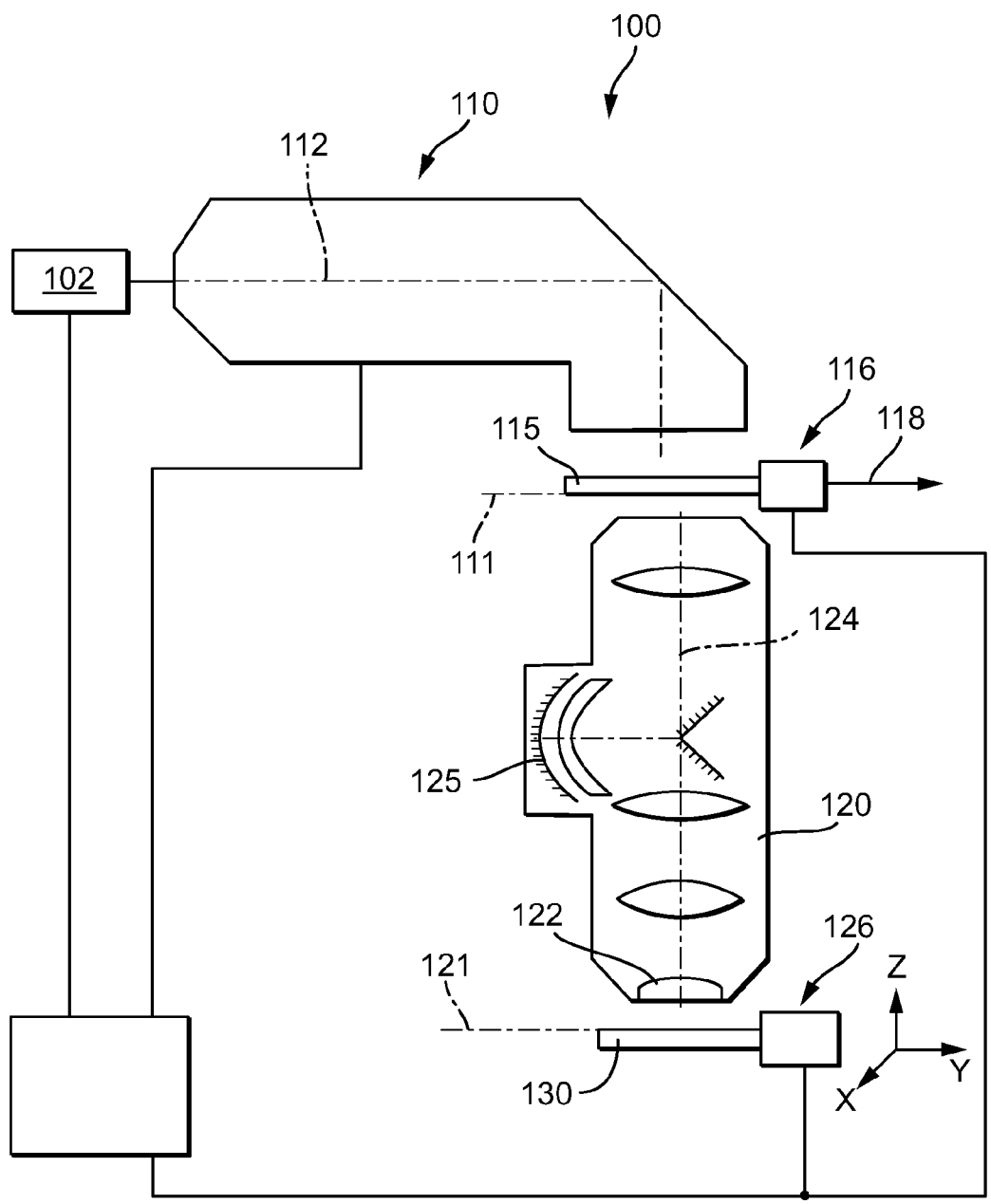
FIG. 1 schematically shows a microlithography projection exposure apparatus in accordance with one embodiment of the invention.

FIG. 1 schematically shows a microlithography projection exposure apparatus 100 in the form of a wafer scanner, which is set up for producing specific layers of large-scale integrated semiconductor components and, depending on the setting, permits imagings with a resolution capability of down to R=180 nm. A xenon fluoride laser (XeF laser) the central operating wavelength of which is approximately 351 nm and which has typical bandwidths of 0.2 nm is used as primary light source 102. Such an XeF laser has emission lines at approximately 351 nm and approximately 353 nm. The emission line at 353 nm is masked out by a filter in the exemplary system. The remaining, closely adjacent emission lines at 351 nm have a spacing of approximately 200 pm and are utilized jointly in this light source.

A downstream illumination system 110 receives the light from the primary light source 102 and generates in its exit plane 111 a large, sharply delimited, very homogeneously illuminated illumination field that is adapted to the telecentricity requirements of the downstream projection objective 120 and is centered about the optical axis 112 of the illumination system. The illumination system 110 has devices for selecting the illumination mode and, in the example, can be changed over between conventional illumination with a variable degree of coherence, annular illumination and dipole or quadrupole illumination.

Arranged between the exit-side last optical element of the illumination system and the entrance of the projection objective is a device 116 for holding and manipulating a mask 115 such that a pattern—arranged on the mask—of a specific layer of the semiconductor component to be produced lies in the object plane 111 of the projection objective, said object plane coinciding with the exit plane of the illumination system. The optical axis 112 of the illumination system and the optical axis 124 of the projection objective are laterally offset relative to one another in order to produce an off-axis field in relation to the optical axis 124 of the projection objective. The device 116—usually referred to as "reticle stage"—for holding and manipulating the mask contains a scanner drive enabling the mask to be moved parallel to the object surface 111 of the projection objective or perpendicular to the optical axis of projection objective and illumination system in a scanning direction 118.

The projection objective 120 follows in the light path downstream of the plane 111 also designated as mask plane, said projection objective, as a reducing objective, being set up for imaging a demagnified image of the structure borne by the mask on a reduced scale, for example on a scale of 4:1 or 5:1 or 10:1, onto a wafer 130 coated with a photoresist layer. The wafer 130 serving as a light-sensitive substrate is arranged in such a way that its planar substrate surface coincides with the image plane 121 of the projection objective 120. The wafer is held by a device 126 (wafer stage) comprising a scanner drive in order to move the wafer synchronously with the mask 115 in a fashion parallel to the latter.

The projection objective 120 has a planar convex lens 122 as last, transparent optical component nearest the image plane 121, the planar exit surface of said planar convex lens, as last optical surface of the projection objective, being arranged at a working distance of a few millimetres above the substrate surface of the wafer in such a way that there is a gas-filled gap situated between the exit surface of the projection objective and the substrate surface (dry system).

The projection objective 120 acting as a reducing objective has, in addition to a plurality of schematically indicated lenses (typical numbers of lenses are often more than 10 or more than 15 lenses) and, if appropriate, other transparent optical components, a (at least one) concave mirror 125, which in the case of the example is arranged in proximity to a pupil surface of the projection objective. For the applications that are of primary significance, the image-side numerical aperture of the projection objective is NA>0.6, and in many embodiments it is between approximately NA=0.65 and NA=0.85. As a result, typical resolutions of down to R=180 nm are possible at the operating wavelength predefined by the light source 102.

Figure 2:
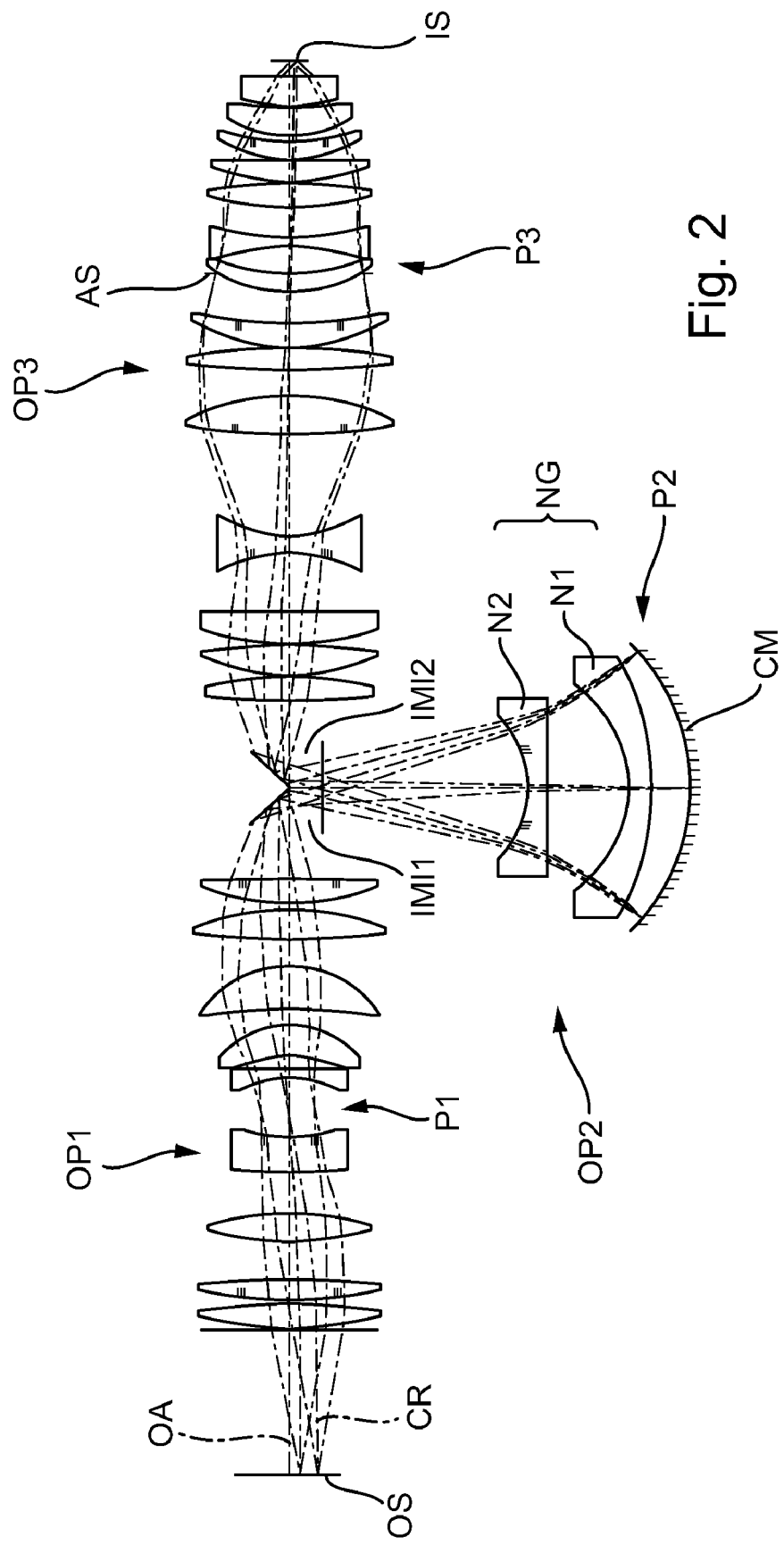
FIG. 2 is a schematic lens section through a first embodiment of a catadioptric projection objective for use in a projection exposure apparatus in accordance with FIG. 1.

FIG. 2 shows a first embodiment of a catadioptric projection objective 200, which can be used in the projection exposure apparatus in accordance with FIG. 1. It is provided for imaging a pattern—arranged in its object plane OS—of a mask on a reduced scale of 4:1 onto its image plane IS, which is oriented parallel to the object plane. In this case, precisely two real intermediate images IMI1 and IMI2 are generated between object plane and image plane. A first, purely refractive objective part OP1 is designed in such a way that the pattern situated in the object plane is imaged into the first intermediate image IMI1 on a scale of approximately $\beta_1 = -0.8$. A catadioptric second objective part OP2 images the first intermediate image IMI1 into the second intermediate image IMI2 essentially without any change in size (imaging scale $|\beta_2| \approx 1:1$). A third, purely refractive (dioptric) objective part OP3 is designed for imaging the second intermediate image IMI2 into the image plane IS with great demagnification ($|\beta_3| \ll 1$).

The projection objective 200 is an example of a "concatenated" projection objective having a plurality of cascaded objective parts which are each configured as imaging systems and are linked via intermediate images, the image (intermediate image) generated by a preceding imaging system in the light path serving as object for the succeeding imaging system in the light path, which succeeding imaging system can generate a further intermediate image (as in the case of the second objective part OP2) or forms the last imaging system of the projection objective, which generates the image field in the image plane of the projection objective (like the third objective part OP3). Systems of the type shown in FIG. 2 are also referred to as R-C-R system where "R" denotes a refractive imaging system and "C" denotes a catadioptric imaging system.

Between the object plane and the first intermediate image, between the first and second intermediate images, and also between the second intermediate image and the image plane, pupil surfaces of the imaging system are located where the chief ray CR of the optical imaging intersects the optical axis OA. The pupil surface P1 of the first objective part OP1 is freely accessible. A concave mirror CM, preceded directly upstream by a negative group NG that has two negative lenses N1, N2 and is passed through twice, is arranged in the region of the second pupil surface P2 within the catadioptric objective part OP2. The two lenses N1, N2 of the negative group are arranged coaxial with the concave mirror. No optical element is arranged between the lenses of the negative group and the concave mirror. An adjustable aperture diaphragm AS situated between the region of maximum beam diameter of the third objective part and the image plane IS is arranged in the region of the third pupil surface P3 within the third objective part OP3.

In so far as reference is made to a "marginal ray height" (MRH) or a "chief ray height" (CRH) in this application, this is taken to mean the paraxial marginal ray height and the paraxial chief ray height.

Table 2 summarizes the specification of the design in tabular form. In this case, column 1 specifies the number of a refractive surface or surface distinguished in some other way, column 2 specifies the radius r of the surface (in mm), column 4 specifies the distance d—as thickness—between the surface and the subsequent surface (in mm) and column 5 specifies the material of the optical components. Column 6 indicates the refractive index of the material, and column 7 specifies the usable free radii or the free semidiameter or the lens height of the lenses (in mm). Radius r=0 corresponds to a planar surface. The aspheres are identified in column 3. Table 2A specifies the corresponding aspheric data, the aspheric surfaces being calculated according to the following specification:

$$p(h) = [((1/r)h^2)/(1+SQRT(1-(1+K)(1/r)^2h^2))] + C1*h^4 + C2*h^6 + \ldots$$

In this case, the reciprocal (1/r) of the radius specifies the surface curvature and h specifies the distance between a surface point and the optical axis (i.e. the ray height). Consequently, p(h) specifies the so-called sagitta, that is to say the distance between the surface point and the surface vertex in the z direction (direction of the optical axis). The constants K, C1, C2 . . . are reproduced in Table 2A.

Given a demagnifying imaging scale of 4:1 ($\beta=-0.25$) the projection objective that is telecentric on the object side and on the image side has an image-side numerical aperture NA=0.7 and is optimized for a central operating wavelength $\lambda=351.1$ nm. All the lenses consist of synthetic fused silica, which has a refractive index $n_{sio2}=1.4767$ at $\lambda=351.1$ nm. The image field size is 26 mm by 5.5 mm.

In the case of the light source radiating in broadband fashion, the projection objective must be designed for reducing the chromatic aberrations to an extent such that it is possible to realize a polychromatic imaging with sufficient quality for the lithographic application. To a first approximation, it is necessary here primarily to correct the primary chromatic aberrations such as the longitudinal chromatic aberration (CHL) and the chromatic magnification aberration (CHV). In addition, the Gaussian aberration (chromatic variation of the aperture aberration) should be minimized as far as possible. What are of great importance for the correction of the chromatic aberrations are primarily the diameters used for the concave mirror CM and the diverging lenses N1 and N2 that are passed through twice upstream of the mirror and also the diameters of the lenses in the rear, third objective part near the image. These are crucial for the correction of the longitudinal chromatic aberration. The chromatic magnification aberration CHV is substantially influenced by the refractive power distribution of the lenses upstream and downstream of the pupil positions and by the skilful positioning of the lenses in relation to the chief ray heights.

The projection objective 200 exhibits outstanding chromatic correction, where CHL=−0.057 nm/pm, CHV=−0.009 nm/pm. The chromatic defocus aberration is 0 nm/pm. The chromatic overcorrection required in an overall system having positive refractive power takes place predominantly in the region of the negative lenses N1 and N2 which directly precede the concave mirror of the second objective part OP2 and which are also referred to hereinafter as "negative group" or "Schupmann lenses". In the embodiment these are dimensioned with regard to diameter and refractive power such that the sum of their overcorrecting contributions to the chromatic correction essentially precisely balances the sum of the undercorrecting contributions of the first objective part OP1, which serves as relay system, and of the refractive third objective part OP3, which serves as focusing system. This becomes clear from Table 2B, which shows the contributions of the individual optical surfaces (column 1) to the longitudinal chromatic aberration CHL (column 2) and to the chromatic magnification aberration CHV (column 3) for the projection objective 200. If the sum of the contributions of the i-th objective part to the longitudinal chromatic aberration is designated by CHLi, i=1, 2, 3, and the sum of the corresponding contributions to the chromatic magnification aberration is designated by CHVi, i=1, 2, 3, then it holds true:

CHL1=−0.008057;

CHV1=−0.004255;

CHL2=0.030971;

CHV2=0.002446;

CHL3=−0.022857;

CHV3=0.001818.

From the sums of all the contributions, this yields for the total longitudinal chromatic aberration CHL=CHL1+CHL2+CHL3=0.000057 and for the total sum of the contributions to the chromatic magnification aberration CHV=CHV1+CHV2+CHV3=0.000009. Consequently for CHL more than 68% of the chromatic overcorrection is effected by the Schupmann lenses N1 and N2, whereby the contribution of all the other subsystems is largely compensated for.

This example illustrates that in such systems it is not necessary to use materials having different dispersions for the chromatic correction. This does not rule out the fact that lenses having at least two different materials can be used in embodiments of the invention. By way of example instead of a lens made of synthetic fused silica, it is possible to use a corresponding lens made of the special glass FK5, which has very similar optical properties with regard to Abbe number and dispersion (e.g. dispersion approximately 3% higher), with the result that the arrangement and form of the lenses differ only slightly in variants of this type. The following considerations may be useful in the material selection. The Abbe number v for a material having a refractive index n (dependent on the wavelength $\lambda$) shall be defined generally as follows:

$$v = \frac{n-1}{n_{\lambda 2} - n_{\lambda 1}},$$

where $\lambda_1$ and $\lambda_2 < \lambda_1$ are different wavelengths that determine the crucial bandwidth for the calculation of the Abbe number. $n_{\lambda 1}$ is the refractive index present at $\lambda_1$. In the wavelength range of the XeF laser at approximately 351.1 nm and with a bandwidth of 1 nm, this results in an Abbe number v=2870 and a dispersion $\Delta n = n\lambda_2 - n\lambda_1 = 1.661 \times 1\phi^{-4}$. The correspondingly calculated values for FK5 are for example: v=2956 and $\Delta n = 1.712 \times 10^{-4}$. The corresponding value for calcium fluoride ($CaF_2$) shall also be specified for comparison for which it holds true that: v=3904 and $\Delta n = 1.143 \times 10^{-4}$. The small difference in dispersion between synthetic fused silica and FK5 shows that these materials can be used essentially alternatively in a system and that a combination of these two materials cannot make an appreciable contribution to the chromatic correction. Although a combination of quartz glass or FK5 with CaF could be utilized for chromatic correction on account of the differences in dispersion, this is not necessary in embodiments of the invention.

The specification for another R-C-R system—not illustrated in the figures—having a construction similar to that in FIG. 2 and NA=0.7 is specified in Tables 2' and 2'A. This projection objective is designed as an i-line objective for an operating wavelength $\lambda$=356.5±2 nm and is distinguished by a longitudinal chromatic aberration CHL=−0.03 nm/pm and a Gaussian aberration of 0.09 nm/pm.

Figure 3:
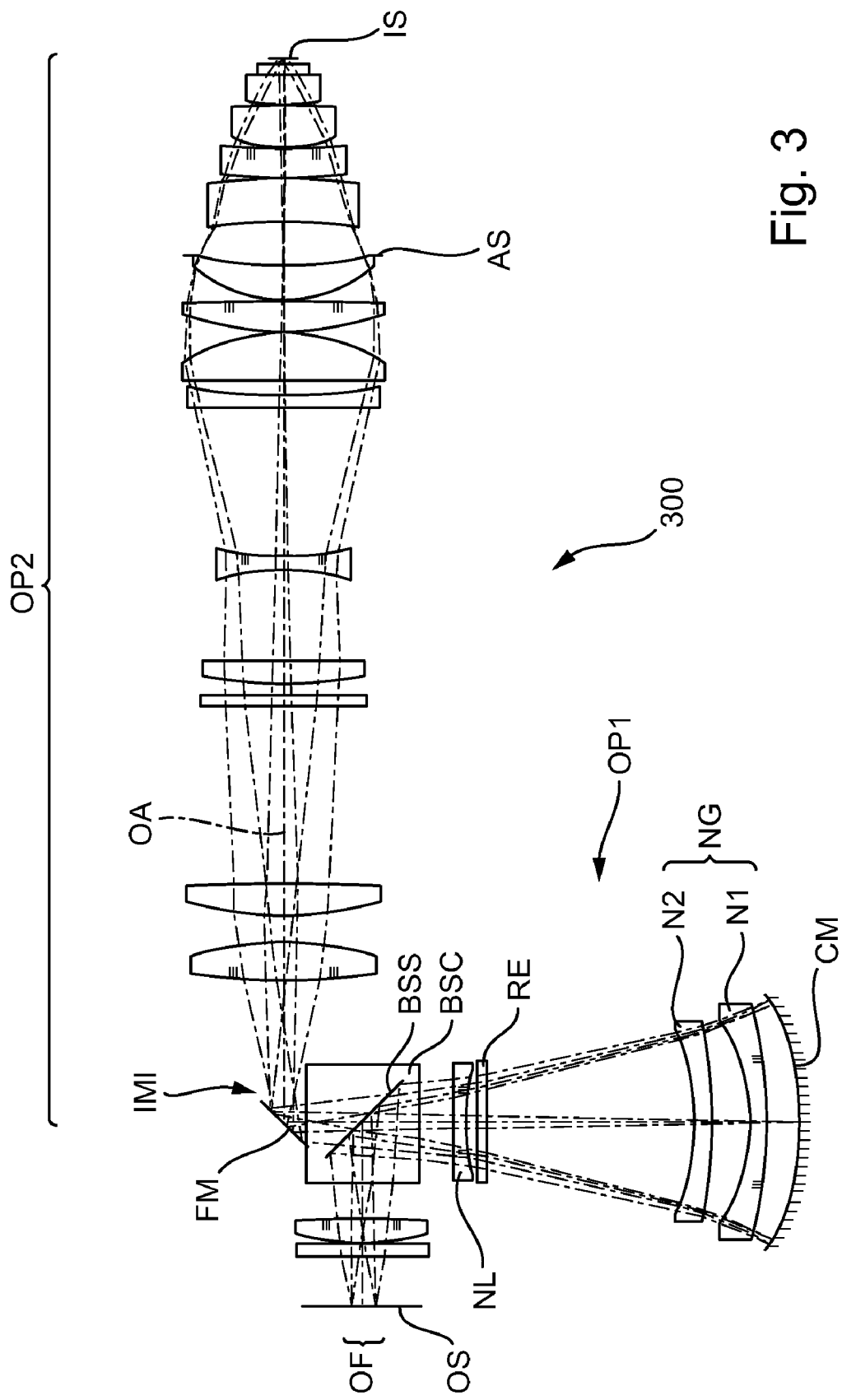
FIG. 3 is a lens section through a second embodiment of a catadioptric projection objective.

FIG. 3 shows a further exemplary embodiment of a catadioptric projection objective 300 with polarization beam splitter, which is designed for an operating wavelength $\lambda$=351.2 nm±2 nm and can accordingly alternatively be incorporated into the projection exposure apparatus equipped with an XeF laser in FIG. 1. The specification of this "cube design" is specified in Tables 3 and 3A. The projection objective is provided for imaging a pattern—arranged in its object plane OS—of a mask on a reduced scale of 4:1 onto its image plane IS oriented parallel to the object plane, with precisely one real intermediate image IMI being produced. In this case, the object field OF arranged in a manner centered about the optical axis OA is imaged into the intermediate image IMI with the aid of a first, catadioptric objective part OP1 without significant magnification or demagnification, said intermediate image being imaged into the centered image field by the subsequent, purely refractive second objective part OP2 on a demagnifying scale of approximately 4:1. The first objective part OP1 contains a concave mirror CM with a negative group NG which is arranged directly before it, comprises two negative meniscus lenses N1 and N2 and brings about a significant proportion of the correction of the longitudinal chromatic aberration. A physical beam splitter BSC having a polarization-selective beam splitter surface BSS placed at 45° with respect to the optical axis serves to separate the radiation passing from the object plane OS to the concave mirror CM from the radiation passing between the concave mirror and the image surface.

The projection objective is operated with linearly polarized light whose preferred direction of polarization (vibration direction of the electric field vector) in the beam path between the object plane OS and the beam splitter BSC is initially s-polarized in relation to the beam splitter surface BSS (vibration direction of the electric field vector perpendicular to the plane of incidence spanned by the folded optical axis), with the result that the radiation is firstly reflected from the beam splitter surface in the direction of the concave mirror. Between the beam splitter surface and the concave mirror, a $\lambda/4$ retardation plate RE is situated in proximity to a negative lens NL, and firstly converts the radiation passing through into circularly polarized radiation that is incident on the concave mirror. On the return path between concave mirror and beam splitter, the $\lambda/4$ plate RE is passed through once again, whereby the radiation is converted into p-polarized radiation that is transmitted by the beam splitter surface essentially without any losses in the direction of the downstream second objective part OP2. A planar folding mirror FM placed at 90° with respect to the beam splitter surface is provided directly behind the beam splitter BSC in the beam path, and ensures, in conjunction with the beam splitter surface, that object plane and image plane can be oriented parallel to one another. The intermediate image arises directly behind said folding mirror at an optical distance from the latter, such that possible defects on the mirror surface do not noticeably impair the imaging. As in the embodiment in accordance with FIG. 2, the adjustable aperture diaphragm AS is situated in the end region of the refractive objective part OP2 between the region of maximum beam diameter and the image plane where the radiation already has a distinctly convergent course towards the image plane IS.

Figure 4:
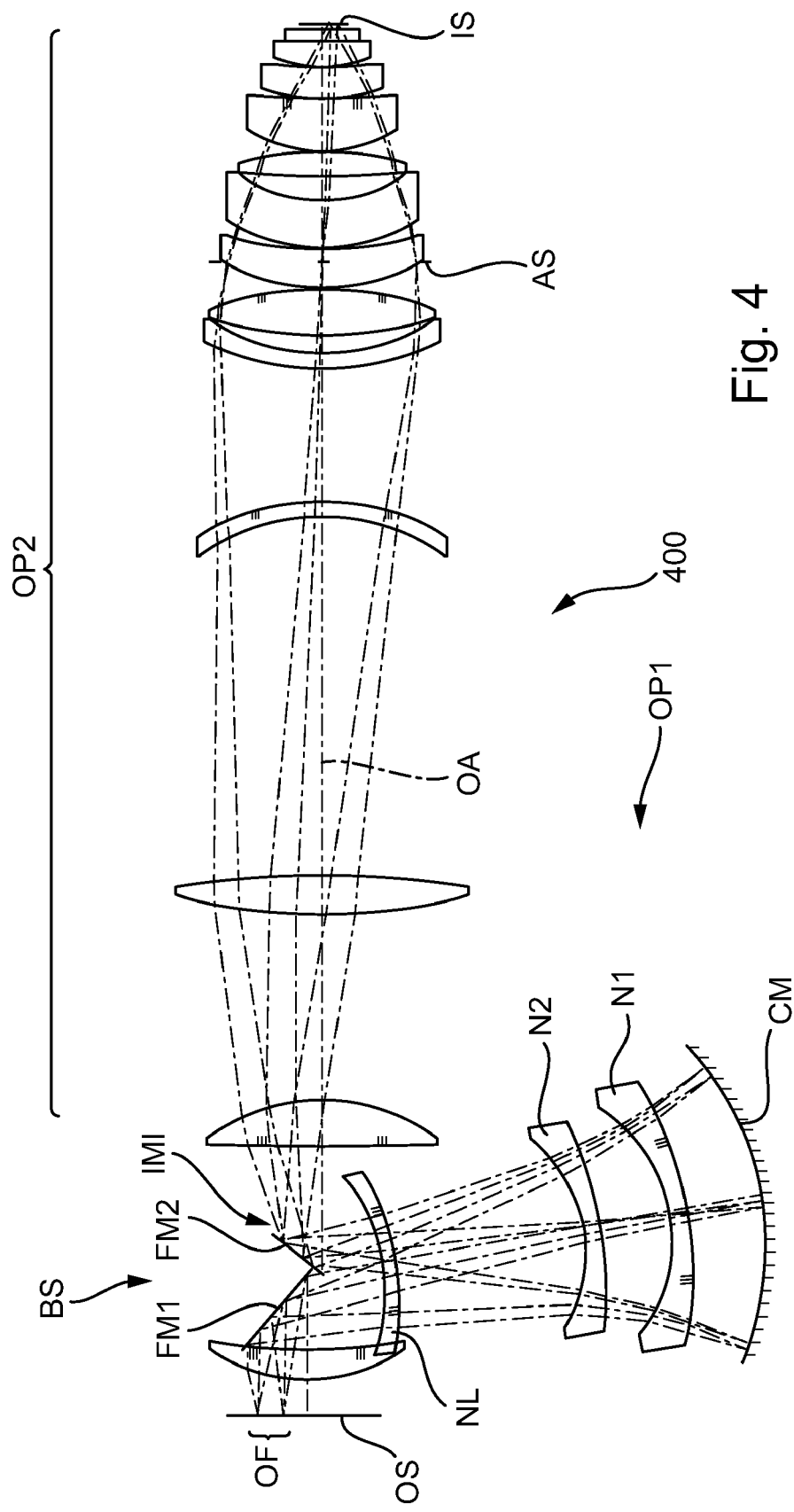
FIG. 4 is a lens section through a third embodiment of a catadioptric projection objective.

FIG. 4 shows a further embodiment of a catadioptric projection objective 400, comprising a geometrical beam splitter BS with a first, planar folding mirror FM1, which is constructionally necessary in the case of this folding variant (h folding), and also an optional, second folding mirror FM2 required for parallel positioning of object plane OS and image plane IS. The specification is specified in Tables 4 and 4A. A first, catadioptric objective part OP1 having a concave mirror CM and a negative group NG that is arranged directly before the latter and has two negative meniscus lenses N1 and N2, and also a thin negative meniscus lens NL that is arranged in the region of relatively small marginal ray heights and has object-side concave surface, images the off-axis object field OF with low demagnification into the sole intermediate image IMI which lies directly behind the second folding mirror FM2 and which is imaged onto the image surface IS in demagnifying fashion by the refractive second objective part OP2. Given a demagnifying imaging scale of 4:1, the projection objective that is telecentric on the object side and the image side has an image-side numerical aperture NA=0.7 and is optimized for a central operating wavelength $\lambda$=351.2 nm. In this case, all of the lenses consist of synthetic fused silica since the chromatic correction, in particular of CHL, can be obtained practically exclusively by the negative meniscus lenses N1 and N2 of the negative group NG that are disposed upstream of the concave mirror CM and arranged in the region of large marginal ray heights. An imaging essentially free of chromatic aberrations is therefore possible even given a bandwidth of 200 pm of the XeF light source.

Figure 5:
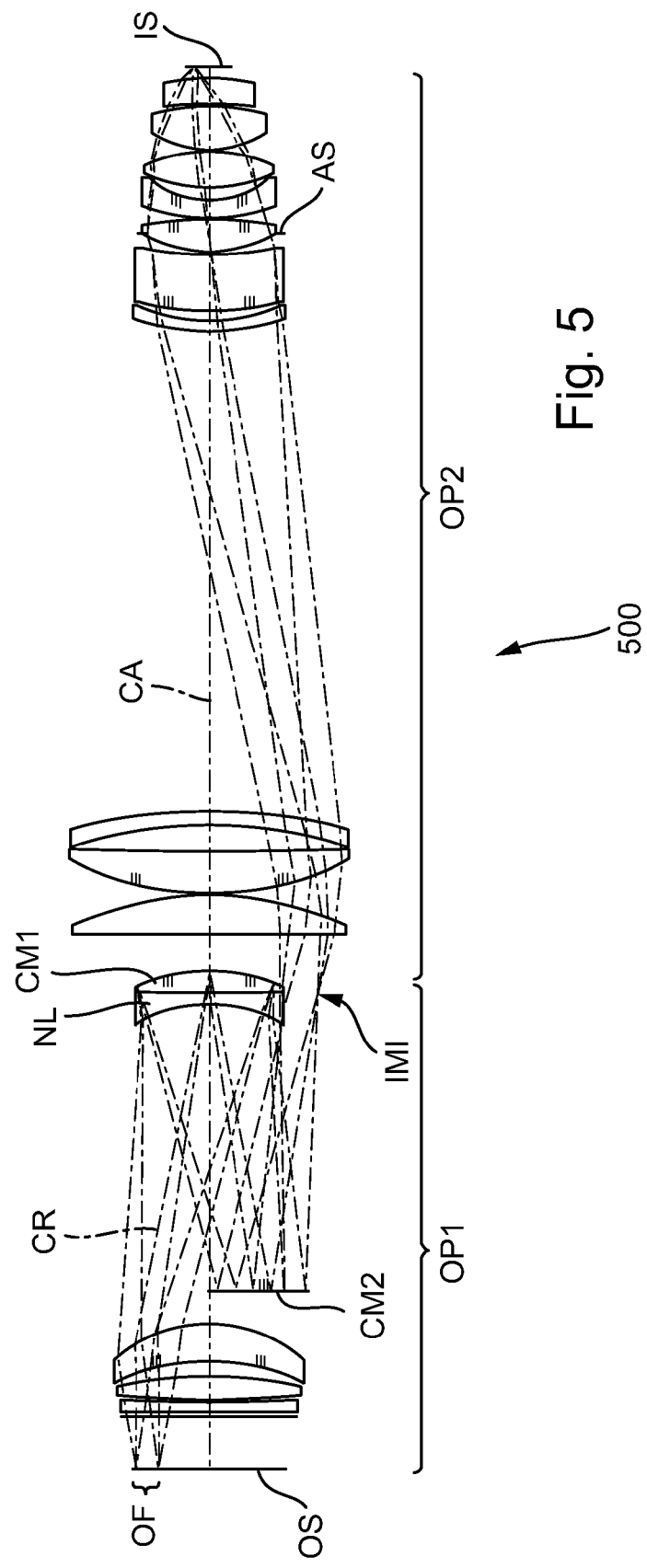
FIG. 5 is a lens section through a fourth embodiment of a catadioptric projection objective.

The catadioptric projection objective 500 shown in FIG. 5 is an example of a so-called in-line system, in which all the optical components have a common, rectilinearly continuous (unfolded) optical axis OA. The specification is specified in Tables 5 and 5A. A first, catadioptric object part OP1 images the off-axis object field OF with a slightly magnifying imaging scale into the sole real intermediate image IMI, which is imaged onto the image surface IS on a greatly demagnifying scale by means of the subsequent, purely refractive second objective part OP2. The first objective part OP1 has a first concave mirror CM1 having a concave aspherical mirror surface facing the object plane, and also a second concave mirror CM2, which is arranged geometrically between the first concave mirror and the object surface and the aspherical mirror surface of which faces the image surface IS. The first concave mirror CM1 is situated in the region of the pupil surface P1 of the first objective part where the chief ray CR of the imaging intersects the optical axis OA; consequently, it is a so-called "pupil mirror". The illuminated surface of the pupil mirror includes the optical axis. By contrast, that region of the second concave mirror CM2 which is utilized for the reflection lies geometrically outside the optical axis OA in a region remote from the pupil; in other words, this mirror is illuminated exclusively abaxially. Situated directly before the first concave mirror CM1 is a biconcave negative lens NL through which radiation passes twice and which, as negative group near the pupil, contributes the main portion of the chromatic correction.

Some important properties of the exemplary embodiments explained here by way of example are represented in summarizing fashion in Table 6. The following are specified for each exemplary embodiment: the image-side numerical aperture NA, the operating wavelength $\lambda$ on which the design is based, the root mean square (RMS) error of the wavefront error for the operating wavelength, the corrected bandwidth $\Delta\lambda$, the averaged wavefront error $RMS_{poly}$ for the entire bandwidth used, the longitudinal chromatic aberration CHL, the Gaussian aberration GF, the diameter DS of the concave mirror, the diameter DL of the largest lens, and the "track length" TL, that is to say the axial distance between object plane and image plane.

It can be discerned from the very low values for CHL and GF that the projection objectives for the broadband application exhibit outstanding chromatic correction. The values for the diameters of the concave mirrors and the largest lenses show that the use of catadioptric projection objectives makes it possible to construct relatively slender systems with moderate lens diameters, with the result that lens material is also used economically. It is possible to obtain these practical advantages without having to use the special glasses—possibly available to a limited extent—for the chromatic correction. All the exemplary embodiments are constructed exclusively with lenses made of synthetic fused silica, which is available on a large scale with high quality.

TABLE 2

| Surface | Radii | | Thickness | Material | Refractive Index | Lens Height | |
|---|---|---|---|---|---|---|---|
| 0 | 0 | | 172.177 | | | 62.00 | |
| 1 | 0 | | 0 | SiO2 | 1.476714 | 92.61 | |
| 2 | 0 | | 0 | | | 92.61 | |
| 3 | 350.64 | | 29.318 | SiO2 | 1.476714 | 94.94 | |
| 4 | −739.523 | | 3.791 | | | 95.19 | |
| 5 | 299.134 | AS | 25.622 | SiO2 | 1.476714 | 94.65 | |
| 6 | −1117.15 | | 45.75 | | | 93.95 | |
| 7 | 335.156 | | 31.731 | SiO2 | 1.476714 | 85.10 | |
| 8 | −336.974 | | 50.611 | | | 83.21 | |
| 9 | 474.305 | | 40.001 | SiO2 | 1.476714 | 54.95 | |
| 10 | 106.336 | AS | 70.123 | | | 40.54 | |
| 11 | −113.666 | | 10.241 | SiO2 | 1.476714 | 47.51 | |
| 12 | 1098.388 | | 16.944 | | | 57.21 | |
| 13 | −165.489 | | 35.001 | SiO2 | 1.476714 | 60.42 | |
| 14 | −101.843 | | 18.772 | | | 71.49 | |
| 15 | −668.042 | | 49.67 | SiO2 | 1.476714 | 92.84 | |
| 16 | −124.464 | | 32.117 | | | 96.67 | |
| 17 | 738.862 | | 35.208 | SiO2 | 1.476714 | 101.35 | |
| 18 | −290.918 | | 8.151 | | | 101.27 | |
| 19 | 245.453 | | 28.949 | SiO2 | 1.476714 | 92.42 | |
| 20 | −2112.418 | AS | 109.419 | | | 89.77 | |
| 21 | 0 | | 38.969 | | | 44.97 | |
| 22 | 0 | | 244.904 | | | 41.55 | Mirror |
| 23 | −123.1 | AS | 24.953 | SiO2 | 1.476714 | 74.99 | |
| 24 | −2299.124 | | 92.576 | | | 89.16 | |
| 25 | −157.433 | | 25.003 | SiO2 | 1.476714 | 114.03 | |
| 26 | −336.506 | | 46.754 | | | 146.81 | |
| 27 | 0 | | 0 | | | 229.53 | |

TABLE 2-continued

| Surface | Radii | | Thickness | Material | Refractive Index | Lens Height | |
|---|---|---|---|---|---|---|---|
| 28 | 246.613 | | 46.754 | | | 164.70 | Mirror |
| 29 | 336.506 | | 25.003 | SiO2 | 1.476714 | 149.91 | |
| 30 | 157.433 | | 92.576 | | | 119.48 | |
| 31 | 2299.124 | | 24.953 | SiO2 | 1.476714 | 99.44 | |
| 32 | 123.1 | AS | 244.904 | | | 82.15 | |
| 33 | 0 | | 0.001 | | | 46.20 | |
| 34 | 0 | | 38.969 | | | 46.20 | Mirror |
| 35 | 0 | | 101.931 | | | 44.75 | |
| 36 | 898.72 | | 28.595 | SiO2 | 1.476714 | 84.33 | |
| 37 | −390.372 | | 0.999 | | | 87.41 | |
| 38 | 222.538 | | 36.092 | SiO2 | 1.476714 | 93.71 | |
| 39 | −813.695 | | 0.998 | | | 93.47 | |
| 40 | 272.095 | | 38.915 | SiO2 | 1.476714 | 91.46 | |
| 41 | −6381.92 | | 69.266 | | | 87.53 | |
| 42 | −157.225 | AS | 20 | SiO2 | 1.476714 | 73.39 | |
| 43 | 134.403 | | 121.23 | | | 72.54 | |
| 44 | 846.914 | AS | 44.598 | SiO2 | 1.476714 | 109.38 | |
| 45 | −264.134 | | 31.943 | | | 110.77 | |
| 46 | 847.33 | | 25.244 | SiO2 | 1.476714 | 109.86 | |
| 47 | −748.803 | | 1.006 | | | 109.34 | |
| 48 | 209.64 | | 27.45 | SiO2 | 1.476714 | 103.87 | |
| 49 | 578.997 | AS | 60.305 | | | 101.07 | |
| 50 | 0 | | −21.802 | | | 85.90 | |
| 51 | 150.184 | | 22.033 | SiO2 | 1.476714 | 85.40 | |
| 52 | 241.425 | | 32.307 | | | 82.90 | |
| 53 | −256.952 | | 10.083 | SiO2 | 1.476714 | 82.09 | |
| 54 | 357.45 | | 34.614 | | | 81.55 | |
| 55 | 306.754 | | 28.814 | SiO2 | 1.476714 | 84.84 | |
| 56 | −568.358 | | 1.342 | | | 84.48 | |
| 57 | 218.878 | | 25.031 | SiO2 | 1.476714 | 81.59 | |
| 58 | 3829.622 | | 0.984 | | | 79.47 | |
| 59 | 138.938 | | 22.982 | SiO2 | 1.476714 | 73.03 | |
| 60 | 404.372 | AS | 5.589 | | | 68.80 | |
| 61 | 131.519 | | 34.806 | SiO2 | 1.476714 | 62.87 | |
| 62 | 469.69 | | 0.998 | | | 52.49 | |
| 63 | 202.542 | | 34.732 | SiO2 | 1.476714 | 49.51 | |
| 64 | 0 | | 19 | | | 34.12 | |

TABLE 2A

Aspheric Constants

| | Surface | | | |
|---|---|---|---|---|
| | 10 | 20 | 23 | 32 |
| K | 0 | 0 | 0 | 0 | 0 |
| C1 | −4.02E−08 | −1.31E−07 | 1.72E−08 | 5.56E−08 | −5.56E−08 |
| C2 | −7.29E−13 | −1.14E−10 | −2.05E−13 | 1.30E−12 | −1.30E−12 |
| C3 | 1.55E−18 | −1.00E−15 | 7.65E−18 | −6.06E−18 | 6.06E−18 |
| C4 | −2.40E−23 | 6.39E−19 | −6.70E−22 | 2.27E−21 | −2.27E−21 |
| C5 | 4.37E−26 | −7.88E−24 | 7.29E−26 | −1.37E−24 | 1.37E−24 |
| C6 | −2.79E−30 | 5.08E−27 | −3.82E−30 | 1.36E−28 | −1.36E−28 |

| | Surface | | | |
|---|---|---|---|---|
| | 42 | 44 | 49 | 60 |
| K | 0 | 0 | 0 | 0 |
| C1 | −1.02E−08 | 3.06E−08 | 1.87E−08 | 1.15E−07 |
| C2 | 7.94E−12 | −1.43E−12 | −7.80E−13 | −2.74E−12 |
| C3 | −3.21E−16 | 6.47E−17 | 7.92E−18 | 5.33E−16 |
| C4 | 4.34E−21 | −9.39E−22 | 8.08E−22 | −1.24E−19 |
| C5 | −1.72E−25 | −1.07E−26 | −6.91E−26 | 1.80E−23 |
| C6 | 6.17E−29 | 7.29E−33 | 4.52E−30 | −8.26E−28 |

TABLE 2'

| Surface | Radii | | Thickness | Material | Refractive Index 365 nm | Lens Height | |
|---|---|---|---|---|---|---|---|
| 0 | 0.000 | | 176.827 | | | 54.41 | |
| 1 | 0.000 | | 0.000 | SiO2 | 1.474564 | 82.013 | |
| 2 | 0.000 | | 0.000 | | | 82.013 | |
| 3 | −19718.367 | | 23.128 | SiO2 | 1.474564 | 81.985 | |
| 4 | −292.102 | | 28.328 | | | 83.236 | |
| 5 | 800.830 | AS | 15.158 | SiO2 | 1.474564 | 84.347 | |
| 6 | −1042.540 | | 56.841 | | | 84.673 | |
| 7 | −865.161 | | 28.942 | SiO2 | 1.474564 | 85.24 | |
| 8 | −185.806 | | 101.236 | | | 85.726 | |
| 9 | 72.230 | | 33.701 | SiO2 | 1.474564 | 56.402 | |
| 10 | 90.972 | AS | 88.997 | | | 47.622 | |
| 11 | −54.979 | | 15.063 | SiO2 | 1.474564 | 37.032 | |
| 12 | 1581.978 | | 13.029 | | | 47.674 | |
| 13 | −176.374 | | 34.998 | SiO2 | 1.474564 | 50.603 | |
| 14 | −102.728 | | 2.196 | | | 61.477 | |
| 15 | −2171.621 | | 42.619 | SiO2 | 1.474564 | 69.886 | |
| 16 | −122.816 | | 1.001 | | | 74.794 | |
| 17 | 697.014 | | 29.577 | SiO2 | 1.474564 | 76.474 | |
| 18 | −223.054 | | 1.000 | | | 76.502 | |
| 19 | 283.360 | | 22.253 | SiO2 | 1.474564 | 72.25 | |
| 20 | −956.384 | AS | 87.120 | | | 70.02 | |
| 21 | 0.000 | | 302.696 | | | 62.46 | Mirror |
| 22 | 143.355 | AS | 16.736 | SiO2 | 1.474564 | 77.376 | |
| 23 | 2480.121 | | 81.893 | | | 87.983 | |
| 24 | 147.470 | | 14.584 | SiO2 | 1.474564 | 105.134 | |
| 25 | 368.278 | | 43.425 | | | 126.691 | |
| 26 | 221.491 | | 43.425 | | | 138.954 | Mirror |
| 27 | 368.278 | | 14.584 | SiO2 | 1.474564 | 125.148 | |
| 28 | 147.470 | | 81.893 | | | 104.295 | |
| 29 | 2480.121 | | 16.736 | SiO2 | 1.474564 | 87.434 | |
| 30 | 143.355 | AS | 302.696 | | | 77.156 | |
| 31 | 0.000 | | 51.133 | | | 55.769 | Mirror |
| 32 | −200.976 | | 21.420 | SiO2 | 1.474564 | 56.674 | |
| 33 | 680.135 | | 11.152 | | | 57.805 | |
| 34 | −562.432 | | 17.682 | SiO2 | 1.474564 | 59.753 | |
| 35 | 562.830 | | 47.790 | | | 60.252 | |
| 36 | −236.854 | | 40.000 | SiO2 | 1.474564 | 61.367 | |
| 37 | −1546.424 | | 18.936 | | | 59.066 | |
| 38 | 156.229 | AS | 10.013 | SiO2 | 1.474564 | 58.619 | |
| 39 | −226.425 | | 139.573 | | | 61.579 | |
| 40 | −568.261 | AS | 44.696 | SiO2 | 1.474564 | 105.078 | |
| 41 | 279.788 | | 174.740 | | | 106.637 | |
| 42 | −195.077 | | 40.133 | SiO2 | 1.474564 | 105.278 | |
| 43 | 6098.289 | AS | 42.766 | | | 103.174 | |
| 44 | 0.000 | | 21.290 | | | 91.903 | |
| 45 | −170.175 | | 26.099 | SiO2 | 1.474564 | 91.33 | |
| 46 | −378.312 | | 26.006 | | | 88.623 | |
| 47 | 344.391 | | 15.107 | SiO2 | 1.474564 | 87.435 | |
| 48 | 4548.401 | | 62.468 | | | 85.019 | |
| 49 | −966.806 | | 21.276 | SiO2 | 1.474564 | 75.29 | |
| 50 | 511.375 | | 1.000 | | | 73.693 | |
| 51 | −209.251 | | 22.697 | SiO2 | 1.474564 | 69.003 | |
| 52 | 1404.235 | AS | 1.000 | | | 65.971 | |
| 53 | −80.965 | | 29.116 | SiO2 | 1.474564 | 55.695 | |
| 54 | −298.685 | | 6.479 | | | 49.332 | |
| 55 | −545.144 | | 29.986 | SiO2 | 1.474564 | 45.65 | |
| 56 | 0.000 | | 19.000 | | | 30.798 | |
| 57 | 0.000 | | 0.000 | | | 13.603 | |

TABLE 2'A

Aspheric Constants

| | Surface | | | |
|---|---|---|---|---|
| | 5 | 10 | 20 | 22 |
| K | 0.00000E+00 | 0.00000E+00 | 0 | 0 |
| C1 | −5.02585E−08 | −1.38515E−07 | 2.53159E−08 | −4.67926E−08 |
| C2 | −9.06925E−13 | −5.84508E−11 | −2.30376E−13 | 3.00852E−13 |

TABLE 2'A-continued

| Aspheric Constants | | | | |
|---|---|---|---|---|
| C3 | −1.00335E−17 | 1.96118E−15 | 1.38762E−17 | 1.20999E−17 |
| C4 | −2.61387E−22 | 5.20762E−19 | −1.93621E−21 | 1.84312E−20 |
| C5 | 1.82082E−27 | −1.83546E−23 | 3.23365E−25 | −2.22528E−24 |
| C6 | 1.50365E−31 | 5.52136E−27 | −1.88062E−29 | 2.1258E−28 |

| | Surface | | | | |
|---|---|---|---|---|---|
| | 30 | 38 | 40 | 43 | 52 |
| K | 0 | 0 | 0 | −2.17146E−08 | 0 |
| C1 | −4.67926E−08 | 9.6521E−08 | −1.73748E−08 | 1.96262E−13 | −6.80169E−08 |
| C2 | 3.00852E−13 | −3.5021E−12 | 7.94003E−13 | 8.09633E−18 | 3.27923E−12 |
| C3 | 1.20999E−17 | −1.33753E−16 | −1.51295E−17 | 1.56848E−22 | −3.77619E−16 |
| C4 | 1.84312E−20 | 6.03955E−21 | −5.11214E−23 | −6.34275E−27 | 3.98285E−20 |
| C5 | −2.22528E−24 | −2.23825E−24 | 2.46994E−26 | 4.16085E−32 | −2.06995E−24 |
| C6 | 2.1258E−28 | 2.14956E−28 | −1.0035E−30 | −2.17146E−08 | 5.4894E−29 |

TABLE 2B

| Surface | CHL | CHV | CHL Subsystems | CHV Subsystems | |
|---|---|---|---|---|---|
| 1 | −0.000611 | −3.07E−05 | | | |
| 2 | 0.000611 | 3.07E−05 | | | |
| 3 | −0.000911 | 0.000562 | | | |
| 4 | 0.00026 | 0.000779 | | | |
| 5 | −0.000862 | 0.000248 | | | |
| 6 | 5.81E−05 | 0.001146 | | | |
| 7 | −0.000647 | −0.000481 | | | |
| 8 | −0.000692 | 0.001925 | | | |
| 9 | −4.85E−05 | −0.001211 | | | |
| 10 | 0.001203 | 0.000921 | | | |
| 11 | 0.001 | −0.000788 | | | |
| 12 | 0.000977 | 0.001736 | | | |
| 13 | 0.000133 | −0.001152 | | | |
| 14 | −0.001915 | −0.00026 | | | |
| 15 | −0.000156 | −0.001373 | | | |
| 16 | −0.003016 | −0.001815 | | | |
| 17 | −5.12E−06 | −0.001243 | | | |
| 18 | −0.001934 | −0.001168 | | | |
| 19 | −6.08E−05 | −0.001315 | | | |
| 20 | −0.001441 | −0.000766 | | | |
| | | | −0.008057 | −0.004255 | Relay System OP1 |
| 23 | 0.002201 | −0.001424 | | | |
| 24 | 0.004466 | 0.001008 | | | |
| 25 | 0.004054 | −0.001039 | | | |
| 26 | 0.004764 | 0.001518 | | | |
| 29 | 0.004763 | −0.000766 | | | |
| 30 | 0.004055 | 0.001679 | | | |
| 31 | 0.004466 | −0.000303 | | | |
| 32 | 0.002202 | 0.001773 | | | |
| | | | 0.030971 | 0.002446 | Schupmann Lenses |
| 36 | −0.001478 | 0.000657 | | | |
| 37 | 0.000468 | 0.000693 | | | |
| 38 | −0.002095 | 0.001189 | | | |
| 39 | 0.000128 | 0.001105 | | | |
| 40 | −0.001402 | 0.000207 | | | |
| 41 | −6.88E−05 | 0.001299 | | | |
| 42 | 0.001654 | −0.002182 | | | |
| 43 | 0.003812 | −0.000701 | | | |
| 44 | −0.004134 | −0.000403 | | | |
| 45 | −0.002907 | 0.001709 | | | |
| 46 | −0.002326 | −0.000946 | | | |
| 47 | −0.001775 | 0.001425 | | | |
| 48 | −0.005007 | −0.000712 | | | |
| 49 | −0.000112 | 0.001247 | | | |
| 51 | −0.004075 | −0.001105 | | | |
| 52 | 0.000397 | 0.001233 | | | |
| 53 | 0.004618 | −0.000999 | | | |
| 54 | 0.00105 | 0.001307 | | | |
| 55 | −0.001211 | −0.001413 | | | |
| 56 | −0.002494 | 0.000755 | | | |
| 57 | −0.000505 | −0.001337 | | | |
| 58 | −0.00227 | 0.000679 | | | |

TABLE 2B-continued

| Surface | CHL | CHV | CHL Subsystems | CHV Subsystems | |
|---|---|---|---|---|---|
| 59 | −0.000382 | −0.001332 | | | |
| 60 | −0.002109 | 0.000586 | | | |
| 61 | 0.00077 | −0.000979 | | | |
| 62 | −0.00199 | 0.000211 | | | |
| 63 | 0.001665 | −0.000359 | | | |
| 64 | −0.001078 | −1.59E−05 | | | |
| | | | −0.022857 | 0.001818 | Focus Group OP3 |
| SUM | 0.000057 | 0.000009 | | | |
| | | | 0.000057 | 0.000009 | Sum |

TABLE 3

| Surface | Radii | | Thickness | Material | Refractive Index 351.2 nm | Lens Height | |
|---|---|---|---|---|---|---|---|
| 0 | 0 | | 45 | | | 53.2 | |
| 1 | 0 | | 0 | | | 61.041 | |
| 2 | 0.000 | | 0.000 | SiO2 | 1.476714 | 61.041 | |
| 3 | 0.000 | | 0.000 | | | 61.041 | |
| 4 | 0.000 | | 12.000 | SiO2 | 1.476714 | 61.041 | |
| 5 | 0.000 | | 0.998 | | | 62.45 | |
| 6 | 197.629 | | 22.557 | SiO2 | 1.476714 | 64.519 | |
| 7 | −2180.107 | AS | 38.334 | | | 64.537 | |
| 8 | 0.000 | | 50.000 | SiO2 | 1.476714 | 64.073 | |
| 9 | 0.000 | | 0.000 | SiO2 | 1.476714 | 64.372 | Mirror |
| 10 | 0.000 | | 50.000 | SiO2 | 1.476714 | 63.692 | |
| 11 | 0.000 | | 33.702 | | | 63.329 | |
| 12 | 829.066 | | 12.500 | SiO2 | 1.476714 | 63.008 | |
| 13 | −334.986 | AS | 10.000 | | | 63.405 | |
| 14 | 0.000 | | 10.000 | SiO2 | 1.476714 | 63.846 | |
| 15 | 0.000 | | 193.193 | | | 64.934 | |
| 16 | 225.193 | | 15.000 | SiO2 | 1.476714 | 93.091 | |
| 17 | 546.903 | | 35.135 | | | 99.681 | |
| 18 | 177.821 | | 15.000 | SiO2 | 1.476714 | 102.968 | |
| 19 | 432.528 | AS | 29.297 | | | 115.815 | |
| 20 | 245.035 | | 29.297 | | | 122.059 | Mirror |
| 21 | 432.528 | AS | 15.000 | SiO2 | 1.476714 | 113.264 | |
| 22 | 177.821 | | 35.135 | | | 97.674 | |
| 23 | 546.903 | | 15.000 | SiO2 | 1.476714 | 90.88 | |
| 24 | 225.193 | | 193.193 | | | 82.066 | |
| 25 | 0.000 | | 10.000 | SiO2 | 1.476714 | 54.099 | |
| 26 | 0.000 | | 10.000 | | | 53.251 | |
| 27 | −334.986 | AS | 12.500 | SiO2 | 1.476714 | 52.587 | |
| 28 | 829.066 | | 33.702 | | | 52.253 | |
| 29 | 0.000 | | 100.000 | SiO2 | 1.476714 | 52.398 | |
| 30 | 0.000 | | 22.857 | | | 52.796 | |
| 31 | 0.000 | | 0.000 | | | 54.007 | Mirror |
| 32 | 0.000 | | 24.966 | | | 52.958 | |
| 33 | 0.000 | | 107.553 | | | 53.15 | |
| 34 | −484.601 | AS | 34.970 | SiO2 | 1.476714 | 92.021 | |
| 35 | 318.238 | | 25.499 | | | 94.281 | |
| 36 | −296.856 | | 29.865 | SiO2 | 1.476714 | 101.082 | |
| 37 | 2569.143 | | 165.796 | | | 100.689 | |
| 38 | 0.000 | | 10.000 | SiO2 | 1.476714 | 87.96 | |
| 39 | 0.000 | | 10.000 | | | 87.45 | |
| 40 | −338.306 | | 20.935 | SiO2 | 1.476714 | 85.862 | |
| 41 | 11541.440 | | 84.712 | | | 84.574 | |
| 42 | 192.059 | | 12.500 | SiO2 | 1.476714 | 69.849 | |
| 43 | −261.087 | AS | 138.444 | | | 69.699 | |
| 44 | −2435.383 | | 12.500 | SiO2 | 1.476714 | 92.516 | |
| 45 | −445.214 | | 12.873 | | | 94.737 | |
| 46 | −3613.384 | | 44.766 | SiO2 | 1.476714 | 95.825 | |
| 47 | 159.106 | | 0.996 | | | 97.572 | |
| 48 | −252.041 | | 28.696 | SiO2 | 1.476714 | 92.106 | |
| 49 | 1599.354 | AS | 0.995 | | | 90.188 | |
| 50 | −114.974 | | 31.350 | SiO2 | 1.476714 | 79.689 | |
| 51 | −272.910 | | 11.343 | | | 74.939 | |
| 52 | 0.000 | | 29.661 | | | 74.432 | |
| 53 | 421.975 | | 39.963 | SiO2 | 1.476714 | 66.554 | |
| 54 | 443.498 | | 1.000 | | | 60.182 | |
| 55 | −563.370 | | 26.795 | SiO2 | 1.476714 | 57.694 | |
| 56 | −937.891 | AS | 0.998 | | | 51.271 | |
| 57 | −94.594 | | 39.953 | SiO2 | 1.476714 | 48.373 | |

TABLE 3-continued

| Surface | Radii | Thickness | Material | Refractive Index 351.2 nm | Lens Height |
|---|---|---|---|---|---|
| 58 | 494.747 | 0.993 | | | 39.382 |
| 59 | −174.856 | 27.718 | SiO2 | 1.476714 | 35.393 |
| 60 | 268.569 | 1.220 | | | 24.296 |
| 61 | 0.000 | 10.000 | SiO2 | 1.476714 | 24.412 |
| 62 | 0.000 | 5.984 | | | 19.074 |
| 63 | 0.000 | 0.000 | | | 13.3 |

TABLE 3A

Aspheric Constants

| | Surface | | | |
|---|---|---|---|---|
| | 7 | 13 | 19 | 21 |
| K | 0.00000E+00 | 0.00000E+00 | 0.00000E+00 | 0 |
| C1 | −2.17433E−09 | −7.34506E−08 | 5.09422E−09 | 5.09422E−09 |
| C2 | 2.17097E−13 | −1.61389E−14 | 2.73779E−14 | 2.73779E−14 |
| C3 | −5.02694E−17 | −8.54786E−17 | −3.12207E−18 | −3.12207E−18 |
| C4 | 2.29688E−20 | −1.52633E−20 | −1.04920E−23 | −1.0492E−23 |
| C5 | −4.67889E−24 | 3.81619E−24 | 1.07727E−27 | 1.07727E−27 |
| C6 | 3.76978E−28 | −4.38758E−28 | 2.13340E−31 | 2.1334E−31 |

| | Surface | | | | |
|---|---|---|---|---|---|
| | 27 | 34 | 43 | 49 | 56 |
| K | 0 | 0 | 0 | 0 | 0 |
| C1 | −7.34506E−08 | 1.128E−08 | −4.61047E−08 | −1.93871E−08 | −1.55272E−07 |
| C2 | −1.61389E−14 | −9.03612E−14 | −2.35243E−12 | −1.32409E−14 | −2.23849E−11 |
| C3 | −8.54786E−17 | 3.2584E−18 | −1.23627E−17 | 4.41071E−17 | −1.727E−15 |
| C4 | −1.52633E−20 | −6.74012E−22 | 1.29558E−20 | −8.50818E−22 | 4.99134E−20 |
| C5 | 3.81619E−24 | 6.80863E−26 | −4.48348E−24 | 2.73476E−25 | −8.04316E−23 |
| C6 | −4.38758E−28 | −2.63841E−30 | 3.63347E−28 | −2.16104E−29 | −1.62598E−27 |

TABLE 4

| Surface | Radii | | Thickness | Material | Refractive Index 351.2 nm | Lens Height | |
|---|---|---|---|---|---|---|---|
| 0 | 0 | | 30 | | | 67 | |
| 1 | 135.461 | | 25.972 | SiO2 | 1.476714 | 74.437 | |
| 2 | 426.296 | AS | 64.637 | | | 73.171 | |
| 3 | 0.000 | | 0.000 | | | 94.15 | Mirror |
| 4 | 0.000 | | 67.937 | | | 69.564 | |
| 5 | 155.665 | | 9.998 | SiO2 | 1.476714 | 66.722 | |
| 6 | 215.575 | AS | 168.338 | | | 68.451 | |
| 7 | 131.432 | | 15.000 | SiO2 | 1.476714 | 76.132 | |
| 8 | 373.137 | | 58.764 | | | 83.834 | |
| 9 | 142.141 | | 15.000 | SiO2 | 1.476714 | 93.077 | |
| 10 | 325.833 | AS | 67.311 | | | 107.044 | |
| 11 | 251.578 | | 67.311 | | | 131.109 | Mirror |
| 12 | 325.833 | AS | 15.000 | SiO2 | 1.476714 | 97.382 | |
| 13 | 142.141 | | 58.764 | | | 82.204 | |
| 14 | 373.137 | | 15.000 | SiO2 | 1.476714 | 67.576 | |
| 15 | 131.432 | | 168.338 | | | 62.097 | |
| 16 | 215.575 | AS | 9.998 | SiO2 | 1.476714 | 52.689 | |
| 17 | 155.665 | | 54.070 | | | 51.478 | |
| 18 | 0.000 | | 24.992 | | | 62.432 | Mirror |
| 19 | 0.000 | | 86.593 | | | 54.218 | |
| 20 | −1368.981 | AS | 38.820 | SiO2 | 1.476714 | 87.081 | |
| 21 | 172.778 | | 162.821 | | | 90.099 | |
| 22 | −462.445 | | 33.173 | SiO2 | 1.476714 | 112.042 | |
| 23 | 901.139 | | 314.046 | | | 111.975 | |
| 24 | 186.346 | | 12.500 | SiO2 | 1.476714 | 93.887 | |
| 25 | 189.668 | AS | 116.940 | | | 95.931 | |
| 26 | −240.339 | | 12.500 | SiO2 | 1.476714 | 93.612 | |
| 27 | −172.282 | | 16.559 | | | 90.886 | |
| 28 | −309.749 | | 39.642 | SiO2 | 1.476714 | 91.266 | |
| 29 | 249.695 | AS | 21.749 | | | 90.824 | |
| 30 | 0.000 | | 20.755 | | | 82.563 | |

TABLE 4-continued

| Surface | Radii | | Thickness | Material | Refractive Index 351.2 nm | Lens Height |
|---|---|---|---|---|---|---|
| 31 | −166.632 | | 33.602 | SiO2 | 1.476714 | 82.59 |
| 32 | −300.290 | | 0.990 | | | 78.619 |
| 33 | −147.436 | | 41.674 | SiO2 | 1.476714 | 76.98 |
| 34 | −120.561 | | 21.313 | | | 65.962 |
| 35 | −745.951 | | 20.036 | SiO2 | 1.476714 | 65.457 |
| 36 | 309.759 | | 0.979 | | | 64.388 |
| 37 | −117.313 | | 45.502 | SiO2 | 1.476714 | 58.23 |
| 38 | −350.236 | AS | 0.968 | | | 46.64 |
| 39 | −165.648 | | 26.051 | SiO2 | 1.476714 | 44.5 |
| 40 | −268.723 | | 0.930 | | | 35.355 |
| 41 | −100.751 | | 23.326 | SiO2 | 1.476714 | 33.022 |
| 42 | 494.236 | | 0.238 | | | 24.919 |
| 43 | 0.000 | | 10.000 | SiO2 | 1.476714 | 24.572 |
| 44 | 0.000 | | 3.868 | | | 19.842 |
| 45 | 0.000 | | 0.000 | | | 16.75 |

TABLE 4A

Aspheric Constants

| | Surface | | | |
|---|---|---|---|---|
| | 2 | 6 | 10 | 12 |
| K | 0.00000E+00 | 0.00000E+00 | 0.00000E+00 | 0.00000E+00 |
| C1 | 2.95478E−08 | −2.16063E−08 | 3.40020E−09 | 3.40020E−09 |
| C2 | 5.92986E−13 | −4.40446E−13 | −1.14329E−13 | −1.14329E−13 |
| C3 | −1.36196E−16 | −1.26694E−16 | 5.27453E−18 | 5.27453E−18 |
| C4 | 1.30888E−20 | 1.70446E−20 | −2.27607E−22 | −2.27607E−22 |
| C5 | −1.63022E−24 | −4.20741E−24 | 5.90958E−27 | 5.90958E−27 |
| C6 | 9.45001E−29 | 1.90971E−28 | −3.75640E−31 | −3.75640E−31 |

| | Surface | | | | |
|---|---|---|---|---|---|
| | 16 | 20 | 25 | 29 | 38 |
| K | 0.00000E+00 | 0.00000E+00 | 0.00000E+00 | 0.00000E+00 | 0.00000E+00 |
| C1 | −2.16063E−08 | 2.01107E−08 | −2.54292E−08 | −2.63649E−08 | 1.30968E−07 |
| C2 | −4.40446E−13 | −4.28089E−13 | 4.52099E−13 | 4.30333E−14 | −2.00191E−11 |
| C3 | −1.26694E−16 | 2.08780E−17 | −1.32715E−17 | −1.17254E−17 | 2.04819E−15 |
| C4 | 1.70446E−20 | −1.50708E−21 | 7.76316E−22 | 9.80725E−22 | −4.86180E−19 |
| C5 | −4.20741E−24 | 1.37439E−25 | −9.75510E−27 | −6.40999E−26 | 8.83291E−23 |
| C6 | 1.90971E−28 | −6.51446E−30 | −6.06816E−31 | 3.89136E−30 | −8.36889E−27 |

TABLE 5

| Surface | Radii | | Thickness | Material | Refractive Index | Lens Height | |
|---|---|---|---|---|---|---|---|
| 0 | 0 | | 53.194538 | | | 68 | |
| 1 | 3800.134 | | 10.000 | SiO2 | 1.476665 | 78.142 | |
| 2 | 1922.352 | | 0.998 | | | 79.433 | |
| 3 | 662.532 | | 22.138 | SiO2 | 1.476665 | 80.274 | |
| 4 | −460.290 | | 14.441 | | | 81.195 | |
| 5 | −201.533 | AS | 32.622 | SiO2 | 1.476665 | 81.398 | |
| 6 | −142.141 | | 293.887 | | | 85.338 | |
| 7 | −121.656 | | 9.993 | SiO2 | 1.476665 | 60.812 | |
| 8 | 731.755 | | 19.987 | | | 64.592 | |
| 9 | −176.716 | AS | 19.987 | | | 65.556 | Mirror |
| 10 | 731.755 | | 9.993 | SiO2 | 1.476665 | 62.894 | |
| 11 | −121.656 | | 263.889 | | | 57.256 | |
| 12 | 2572.938 | AS | 328.866 | | | 89.074 | Mirror |
| 13 | 610962.585 | | 35.081 | SiO2 | 1.476665 | 118.582 | |
| 14 | −301.935 | | 0.987 | | | 120.487 | |
| 15 | 252.420 | AS | 39.362 | SiO2 | 1.476665 | 125.076 | |
| 16 | 3344.838 | | 24.188 | | | 123.946 | |
| 17 | −433.934 | | 11.584 | SiO2 | 1.476665 | 123.348 | |
| 18 | −528.911 | | 442.478 | | | 123.312 | |
| 19 | 199.347 | | 9.997 | SiO2 | 1.476665 | 66.871 | |
| 20 | 157.848 | | 8.412 | | | 64.492 | |
| 21 | 173.757 | AS | 54.819 | SiO2 | 1.476665 | 64.173 | |
| 22 | 350.831 | | 1.064 | | | 58.002 | |

TABLE 5-continued

| Surface | Radii | | Thickness | Material | Refractive Index | Lens Height |
|---|---|---|---|---|---|---|
| 23 | 113.866 | | 30.180 | SiO2 | 1.476665 | 58.181 |
| 24 | −271.391 | AS | −13.314 | | | 58.058 |
| 25 | 0.000 | | 14.329 | | | 58.197 |
| 26 | 198.799 | | 15.126 | SiO2 | 1.476665 | 57.335 |
| 27 | 90.489 | AS | 11.413 | | | 53.852 |
| 28 | 127.813 | | 32.882 | SiO2 | 1.476665 | 54.867 |
| 29 | −145.855 | | 0.935 | | | 54.918 |
| 30 | 91.835 | | 40.128 | SiO2 | 1.476665 | 49.727 |
| 31 | −236.843 | | 0.948 | | | 42.552 |
| 32 | 1919.314 | | 24.911 | SiO2 | 1.476665 | 38.941 |
| 33 | −160.166 | | 10.002 | | | 29.623 |
| 34 | 0.000 | | 0.000 | | | 17.002 |

TABLE 5A

Aspheric Constants

| | Surface | | | |
|---|---|---|---|---|
| | 5 | 9 | 12 | 15 |
| K | 0 | 2.33780E+00 | 5.45689E+02 | 0.00000E+00 |
| C1 | −9.03933E−09 | 3.38168E−08 | −2.93438E−09 | −7.39968E−09 |
| C2 | −7.75667E−13 | 2.33448E−12 | −1.16949E−13 | 6.76552E−13 |
| C3 | 4.18118E−16 | 4.59303E−17 | 1.32890E−17 | −1.19953E−16 |
| C4 | −1.15658E−19 | 8.11037E−20 | −5.40050E−21 | 1.02568E−20 |
| C5 | 1.36650E−23 | −2.04337E−23 | 5.30199E−25 | −4.32962E−25 |
| C6 | −5.98713E−28 | 2.84062E−27 | −3.16329E−29 | 7.18020E−30 |

| | Surface | | |
|---|---|---|---|
| | 21 | 24 | 27 |
| K | 0.00000E+00 | 0.00000E+00 | 0 |
| C1 | −1.50613E−07 | 1.12123E−07 | 2.2665E−07 |
| C2 | −8.64207E−12 | 1.40224E−11 | 1.39902E−11 |
| C3 | 4.90202E−16 | −1.39648E−16 | 1.40779E−17 |
| C4 | 1.81224E−20 | 7.6095E−19 | −1.39321E−18 |
| C5 | 1.22465E−23 | −2.46722E−22 | 2.71948E−22 |
| C6 | 1.91136E−28 | 2.15908E−26 | −2.76663E−26 |

TABLE 6

| Type | Design | NA | λ nm | RMS mono mλ | Dl pm | RMS poly mλ | CHL nm/pm | GF nm/pm | DS mm | DL mm | TL mm |
|---|---|---|---|---|---|---|---|---|---|---|---|
| RCR | Table 2 | 0.7 | 351 | 5.3 | 1000 | 8.1 | −0.06 | 0.1 | 330 | 222 | 1500 |
| RCR | Table 2' | 0.7 | 365 | 6.0 | 2000 | 7.5 | −0.03 | 0.09 | 280 | 183 | 1520 |
| Cube | Table 3 | 0.7 | 351 | 5.0 | 200 | 8.0 | −0.1 | 0.7 | 226 | 176 | 1145 |
| h | Table 4 | 0.7 | 351 | 5.5 | 200 | 16.0 | −0.8 | 1.8 | 265 | 200 | 1182 |
| 2M | Table 5 | 0.7 | 351 | 13.0 | 100 | 23.0 | −2.0 | 4.6 | 178 | 116 | 1288 |

What is claimed is:

1. Projection exposure apparatus for exposing a radiation-sensitive substrate arranged at an image surface with at least one image of a pattern of a mask that is arranged at an object surface, comprising:

a light source emitting ultraviolet light from a wavelength band having a bandwidth $\Delta\lambda > 10$ pm around a central operating wavelength $\lambda > 200$ nm;

an illumination system receiving the light from the light source and directing illumination radiation onto the pattern of the mask; and a projection objective projecting a demagnified image of the pattern of the mask onto a light-sensitive substrate with projection light from a wavelength band having a bandwidth $\Delta\lambda > 10$ pm around a central operating wavelength $\lambda > 200$ nm with an image-side numerical aperture NA>0.6;

wherein the projection objective is a catadioptric projection objective and comprises at least one concave mirror, arranged in a region of a pupil surface of the projection objective, and a negative group having at least one negative lens arranged in direct proximity to the concave mirror in a region near the pupil surface, where a marginal ray height of the imaging is greater than a chief ray height.

2. Projection exposure apparatus according to claim 1, wherein the marginal ray height is at least one of at least twice as large as the chief ray height in the region of the negative group.

3. Projection exposure apparatus according to claim 1, wherein no optical element is arranged between the concave mirror and the at least one negative lens of the negative group.

4. Projection exposure apparatus according to claim 1, wherein the negative group is arranged coaxial with the concave mirror.

5. Projection exposure apparatus according to claim 1, wherein the negative group is arranged in direct proximity to the concave mirror such that projection radiation passes twice, in opposite-through radiating directions, through the negative group.

6. Projection exposure apparatus according to claim 1, wherein the negative group consists of a single negative lens.

7. Projection exposure apparatus according to claim 1, wherein the negative group comprises at least two negative lenses.

8. Projection exposure apparatus according to claim 1, wherein the negative group contains at least one diverging meniscus lens.

9. Projection exposure apparatus according to claim 1, wherein the negative group comprises at least one diffractive optical element.

10. Projection exposure apparatus according to claim 1, wherein a diameter and a refractive power of at least one optical element of the negative group are designed such that a sum of overcorrecting contributions of the negative group to the chromatic correction is at least 60% of the sum of undercorrecting contributions of remaining optical elements of the projection objective.

11. Projection exposure apparatus according to claim 1, wherein at least 90% of all lenses of the projection objective are produced from materials having essentially the same dispersion, such that a difference in dispersion of the materials is less than 10%.

12. Projection exposure apparatus according to claim 1, wherein at least 90% of all lenses of the projection objective are produced from the same material.

13. Projection exposure apparatus according to claim 1, wherein all transparent optical components consist of the same material.

14. Projection exposure apparatus according to claim 13, wherein the same material is synthetic fused silica.

15. Projection exposure apparatus according to claim 1, wherein the light source is emits ultraviolet light from a wavelength band having a bandwidth $\Delta\lambda>100$ pm around a central operating wavelength $\lambda>320$ nm.

16. Projection exposure apparatus according to claim 1, wherein the light source contains a mercury vapor lamp.

17. Projection exposure apparatus according to claim 1, wherein the light source is an XeF laser.

18. Projection exposure apparatus according to claim 1, wherein the light source contains at least one light-emitting diode.

19. Projection exposure apparatus according to claim 1, wherein the light source emits ultraviolet light from a wavelength band having a bandwidth $\Delta\lambda>100$ pm around a central operating wavelength $\lambda>320$ nm, and wherein at least 90% of all lenses of the projection objective are produced from materials having essentially the same dispersion, such that a difference in dispersion of materials used being less than 10%.

20. Projection exposure apparatus according to claim 19, wherein at least 90% of all lenses of the projection objective are produced from the same material.

21. Projection exposure apparatus according to one claim 19, wherein all transparent optical components consist of the same material.

22. Projection exposure apparatus according to claim 21, wherein the same material is synthetic fused silica.

23. Projection exposure apparatus according to claim 1, wherein the projection objective is configured such that at least one intermediate image is formed between the object surface and the image surface.

24. Projection exposure apparatus according to claim 1, wherein the projection objective is configured such that exactly two intermediate images are formed between the object surface and the image surface.

25. Projection exposure apparatus according to claim 1, wherein the projection objective comprises:
    a first objective part configured to image the pattern arranged in the object surface into a first intermediate image;
    a second objective part configured to image the first intermediate image into a second intermediate image; and
    a third objective part configured to image the second intermediate image into the image surface.

26. Projection exposure apparatus according to claim 25, wherein the first objective part is a refractive objective part, the second objective part is a catoptric or catadioptric objective part including the at least one concave mirror, and the third objective part is a refractive objective part.

27. Projection exposure apparatus according to claim 1, wherein the projection objective has at least one focus at a wavelength in a design wavelength band that includes wavelengths $\lambda>320$ nm.

28. Projection exposure apparatus according to claim 27, wherein the projection objective has at least one focus at a wavelength in a design wavelength band that includes mercury g-, a- and i-lines.

29. Projection exposure method for exposing a radiation-sensitive substrate arranged at an image surface with at least one image of a pattern of a mask that is arranged at an object surface, comprising:
    illuminating the mask with illumination light from a wavelength band having a bandwidth $\Delta\lambda>10$ pm around a central operating wavelength $\lambda>200$ nm;
    projecting a demagnified image of the pattern of the mask using projection light from a wavelength band having a bandwidth $\Delta\lambda>10$ pm around a central operating wavelength $\lambda>200$ nm with an image-side numerical aperture NA>0.6 and a catadioptric projection objective comprising at least one concave mirror, arranged in a region of a pupil surface of the projection objective, and a negative group having at least one negative lens arranged in direct proximity to the concave mirror in a region near the pupil surface, where a marginal ray height of the imaging is greater than a chief ray height.

30. Method according to claim 29, wherein the mask is illuminated with illumination light from a wavelength band having a bandwidth $\Delta\lambda>100$ pm around a central operating wavelength $\lambda>320$ nm.

31. A projection objective comprising:
    a plurality of optical elements configured to expose a radiation-sensitive substrate arranged at an image surface of the projection objective with at least one demagnified image of a pattern of a mask that is arranged at an object surface of the projection objective with ultraviolet light from a wavelength band having a bandwidth $\Delta\lambda>10$ pm around a central operating wavelength $\lambda>200$ nm with an image-side numerical aperture NA>0.6;
    wherein the projection objective is a catadioptric projection objective and comprises:
        at least one concave mirror, arranged in a region of a pupil surface of the projection objective, and
        a negative group having at least one negative lens arranged in direct proximity to the concave mirror in a region near the pupil surface, where a marginal ray height of the imaging is greater than a chief ray height.

32. Projection objective according to claim 31, wherein the marginal ray height is at least one of at least ten times as large as the chief ray height in the region of the negative group.

33. Projection objective according to claim 31, wherein no optical element is arranged between the concave mirror and the at least one negative lens of the negative group.

34. Projection objective according to claim 31, wherein the negative group is arranged coaxial with the concave mirror.

35. Projection objective according to claim 31, wherein the negative group is arranged in direct proximity to the concave mirror such that projection radiation passes twice, in opposite-through radiating directions, through the negative group.

36. Projection objective according to claim 31, wherein the negative group consists of a single negative lens.

37. Projection objective according to claim 31, wherein the negative group comprises at least two negative lenses.

38. Projection objective according to claim 31, wherein the negative group contains at least one diverging meniscus lens.

39. Projection objective according to claim 31, wherein the negative group comprises at least one diffractive optical element.

40. Projection objective according to claim 31, wherein a diameter and a refractive power of at least one optical element of the negative group are designed such that a sum of overcorrecting contributions of the negative group to the chromatic correction is at least 60% of the sum of undercorrecting contributions of remaining optical elements of the projection objective.

41. Projection objective according to claim 31, wherein at least 90% of all lenses of the projection objective are produced from materials having essentially the same dispersion, such that a difference in dispersion of the materials is less than 10%.

42. Projection objective according to claim 31, wherein at least 90% of all the lenses of the projection objective are produced from the same material.

43. Projection objective according to claim 31, wherein all transparent optical components consist of the same material.

44. Projection objective according to claim 43, wherein the same material is synthetic fused silica.

45. Projection objective according to claim 31, wherein the projection objective is configured to have at least one focus for ultraviolet light from a wavelength band having a bandwidth $\Delta\lambda > 100$ pm around a central operating wavelength $\lambda > 320$ nm.

46. Projection objective according to claim 31, wherein the projection objective is configured such that at least one intermediate image is formed between the object surface and the image surface.

47. Projection objective according to claim 31, wherein the projection objective is configured such that exactly two intermediate images are formed between the object surface and the image surface.

48. Projection objective according to claim 31, further comprising:

a first objective part configured to image the pattern arranged in the object surface into a first intermediate image;

a second objective part configured to image the first intermediate image into a second intermediate image; and a third objective part configured to image the second intermediate image into the image surface.

49. Projection objective according to claim 48, wherein the first objective part is a refractive objective part, the second objective part is a catoptric or catadioptric objective part including the at least one concave mirror, and the third objective part is a refractive objective part.

50. Projection objective according to claim 31, having at least one focus at a wavelength in a design wavelength band that includes mercury g-, h- and i-lines.

51. Projection exposure apparatus for exposing a radiation-sensitive substrate arranged at an image surface with at least one image of a pattern of a mask that is arranged at an object surface, comprising:

a light source emitting ultraviolet light from a wavelength band having a bandwidth $\Delta\lambda > 100$ pm around a central operating wavelength $\lambda > 320$ nm;

an illumination system receiving the light from the light source and directing illumination radiation onto the pattern of the mask; and a projection objective projecting a demagnified image of the pattern of the mask onto a light-sensitive substrate with projection light from a wavelength band having a bandwidth $\Delta\lambda > 100$ pm around a central operating wavelength $\lambda > 320$ nm with an image-side numerical aperture NA>0.6;

wherein the projection objective is a catadioptric projection objective and comprises at least one concave mirror; and wherein at least 90% of all lenses of the projection objective are produced from materials having essentially the same dispersion, such that a difference in dispersion of the materials is less than 10%.

52. A projection objective comprising:

a plurality of optical elements configured to expose a radiation-sensitive substrate arranged at an image surface of the projection objective with at least one demagnified image of a pattern of a mask that is arranged at an object surface of the projection objective with ultraviolet light from a wavelength band having a bandwidth $\Delta\lambda > 100$ pm around a central operating wavelength $\lambda > 320$ nm with an image-side numerical aperture NA>0.6;

wherein the projection objective is a catadioptric projection objective and further comprises at least one concave mirror; and wherein at least 90% of all lenses of the projection objective are produced from materials having differences in respective dispersion of less than 10%.

\* \* \* \* \*

UNITED STATES PATENT AND TRADEMARK OFFICE
CERTIFICATE OF CORRECTION

PATENT NO. : 7,834,981 B2
APPLICATION NO. : 11/747630
DATED : November 16, 2010
INVENTOR(S) : Hans-Juergen Rostalski et al.

It is certified that error appears in the above-identified patent and that said Letters Patent is hereby corrected as shown below:

Column 2, Line 37: Delete "(in line" and insert -- (in-line --

Column 2, Line 40: Delete "wave-length" and insert -- wavelength --

Column 9, Line 26: Delete "($\beta_3$<<1)." and insert -- ($|\beta_3|$<<1). --

Signed and Sealed this
Seventh Day of June, 2011

David J. Kappos
*Director of the United States Patent and Trademark Office*